United States Patent
Watabe et al.

(10) Patent No.: US 9,978,989 B2
(45) Date of Patent: May 22, 2018

(54) METHOD OF FABRICATING DISPLAY DEVICE RING SHAPE RIB LAYER

(71) Applicant: Japan Display Inc., Tokyo (JP)

(72) Inventors: Kazufumi Watabe, Tokyo (JP); Hiroshi Kawanago, Tokyo (JP); Manabu Yamashita, Tokyo (JP); Hideaki Ishige, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days. days.

(21) Appl. No.: 15/229,629

(22) Filed: Aug. 5, 2016

(65) Prior Publication Data

US 2017/0040569 A1 Feb. 9, 2017

(30) Foreign Application Priority Data

Aug. 7, 2015 (JP) ................. 2015-157534

(51) Int. Cl.
| | |
|---|---|
| *H01L 51/52* | (2006.01) |
| *H01L 27/32* | (2006.01) |
| *H01L 51/00* | (2006.01) |
| *H01L 51/56* | (2006.01) |

(52) U.S. Cl.
CPC ...... *H01L 51/5253* (2013.01); *H01L 27/3244* (2013.01); *H01L 51/003* (2013.01); *H01L 51/5203* (2013.01); *H01L 51/56* (2013.01); *H01L 2227/323* (2013.01); *H01L 2227/326* (2013.01); *H01L 2251/566* (2013.01)

(58) Field of Classification Search
CPC ............. H01L 51/5253; H01L 27/3244; H01L 51/003; H01L 51/5203; H01L 51/56
See application file for complete search history.

(56) References Cited

U.S. PATENT DOCUMENTS

| | | | | |
|---|---|---|---|---|
| 6,720,203 B2* | 4/2004 | Carcia | ................. | H01L 51/0001 257/40 |
| 2003/0207488 A1* | 11/2003 | Carcia | ................. | H01L 51/0001 438/82 |
| 2005/0099117 A1 | 5/2005 | Iga | | |
| 2010/0295759 A1 | 11/2010 | Tanaka | | |

FOREIGN PATENT DOCUMENTS

| | | |
|---|---|---|
| JP | 2006-185679 A | 7/2006 |
| JP | 2011-227369 A | 11/2011 |

OTHER PUBLICATIONS

Korean Office Action dated Sep. 12, 2017 for corresponding Korean Patent Application No. 10-2016-0098880.

\* cited by examiner

*Primary Examiner* — Alonzo Chambliss

(74) *Attorney, Agent, or Firm* — Typha IP LLC

(57) ABSTRACT

First rib layers made of an inorganic material are formed in first frame regions of a first glass substrate. First resin layers are formed in first product regions after the first rib layers are formed. First functional layers which include light emitting element layers as a result of luminance of each of unit pixels forming an image being controlled and sealing layers covering the light emitting element layers are formed on the first rib layers and the first resin layers. The first rib layers and the first functional layers are cut along lines passing through the first frame regions while avoiding the first product regions in order to separate the first product regions from each other. In the step of cutting the first rib layers and the first functional layers, the first rib layers and the sealing layers are cut.

19 Claims, 27 Drawing Sheets

FIG.8
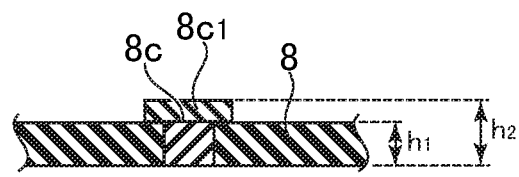
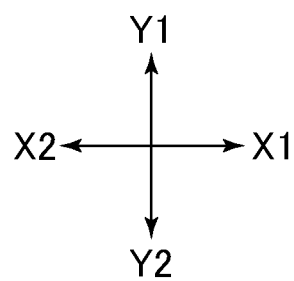
FIG.9
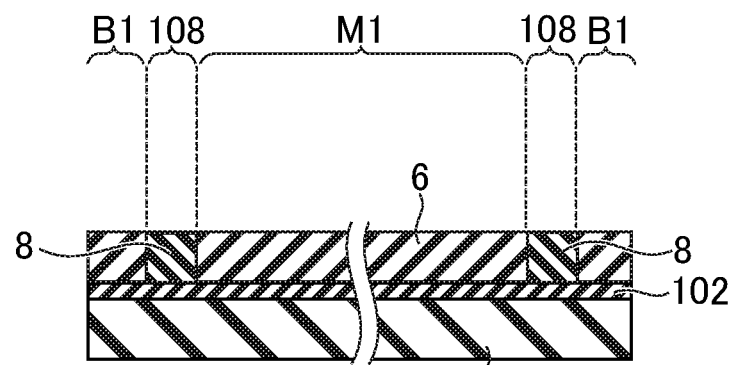
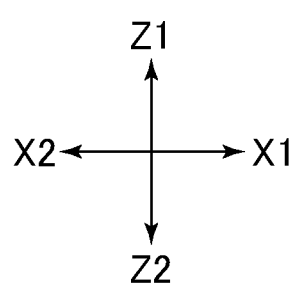

FIG.12
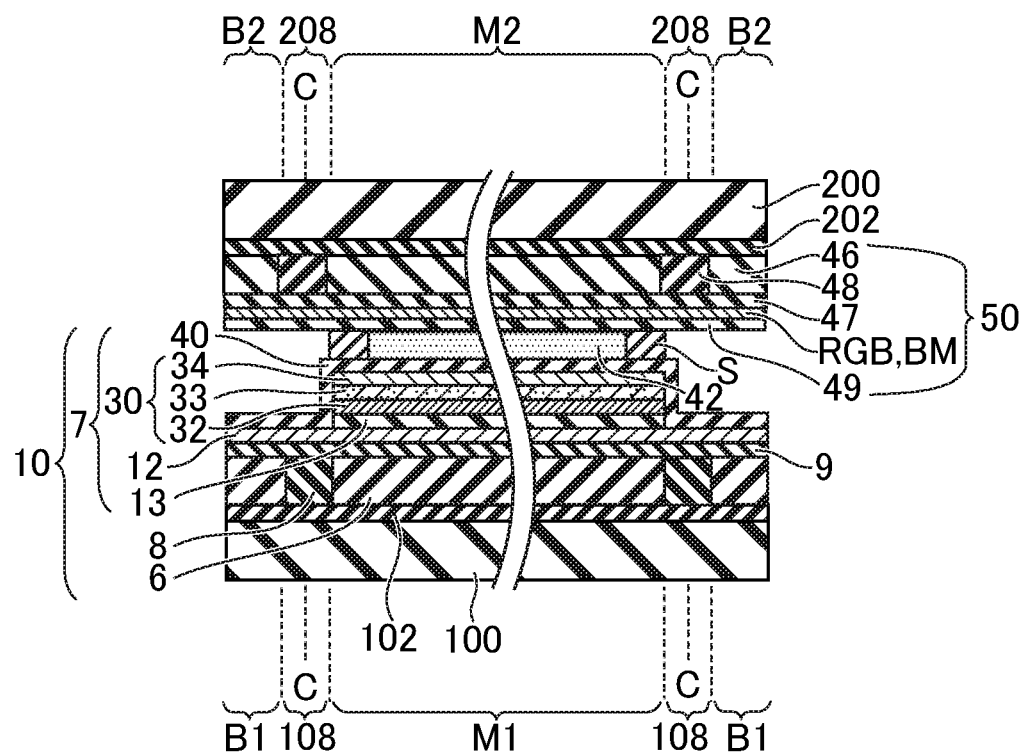
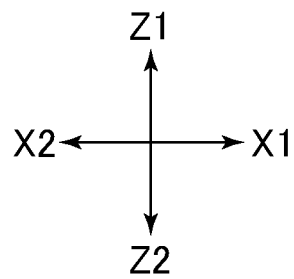

FIG.13
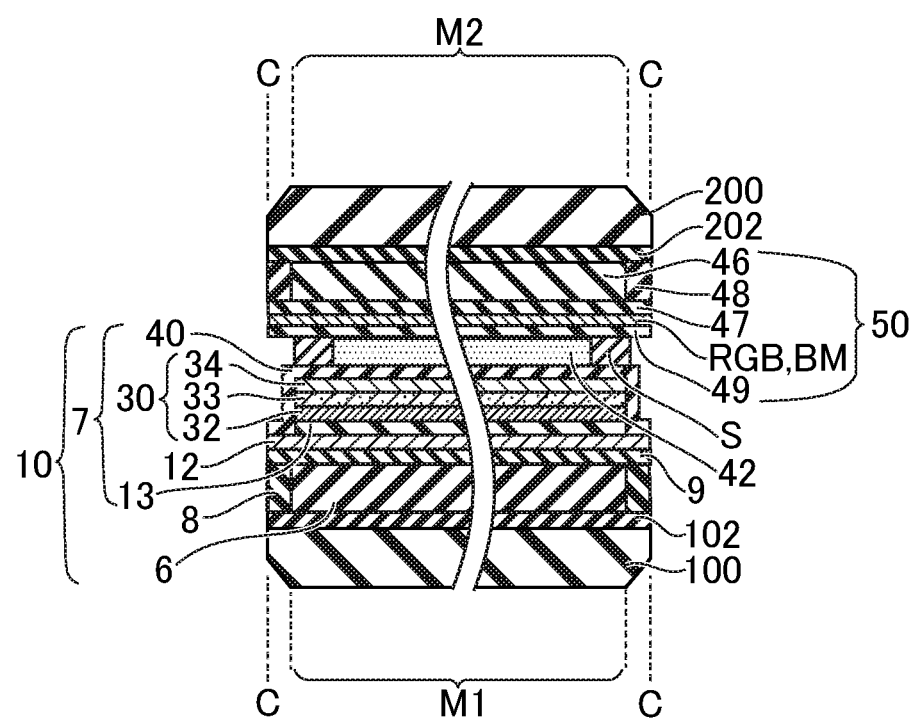
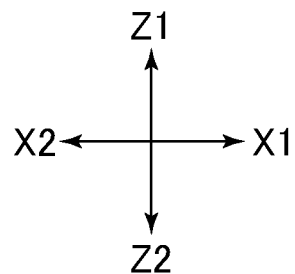

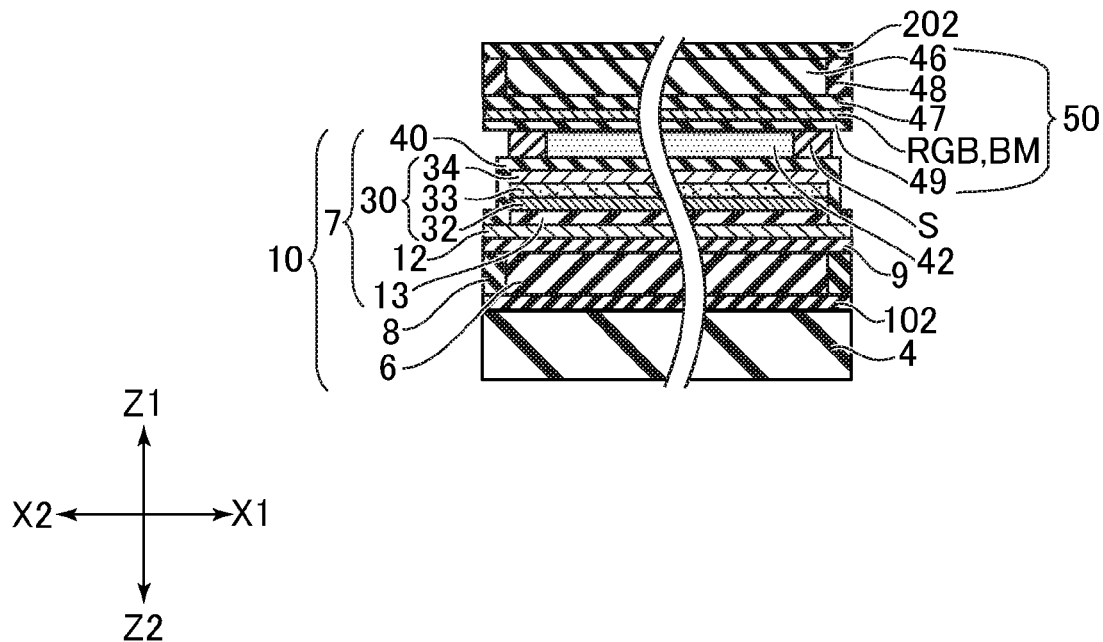
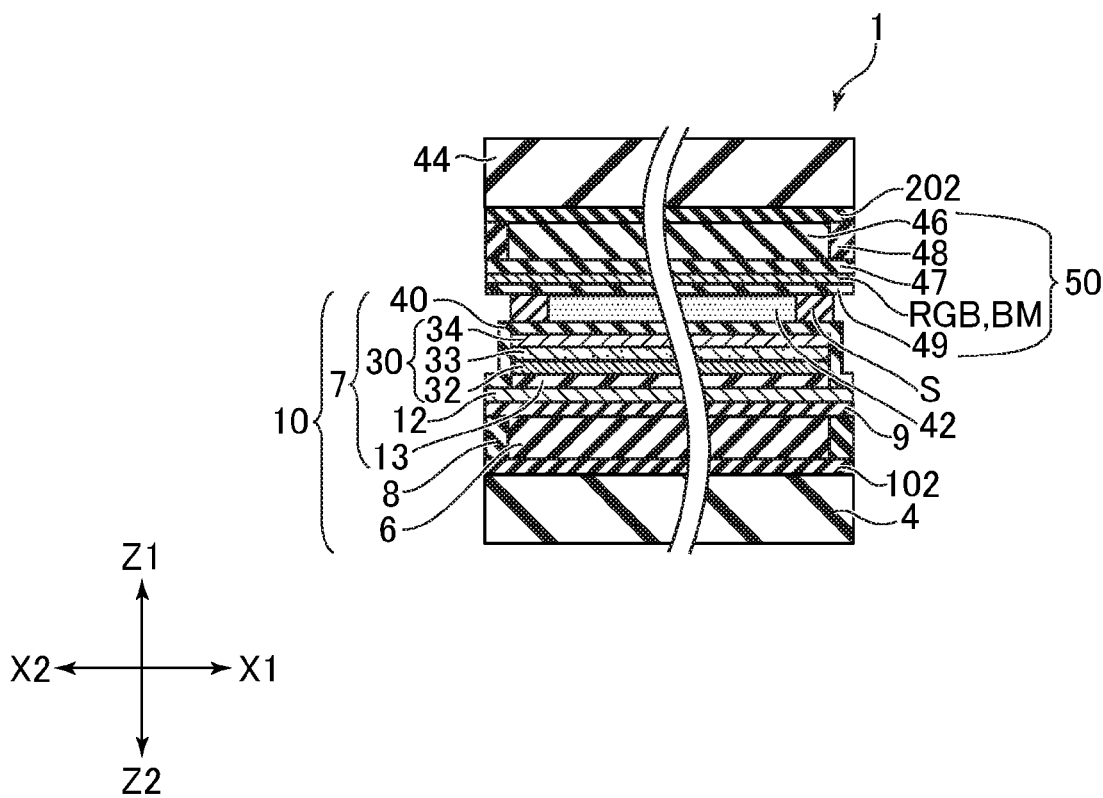

FIG.22
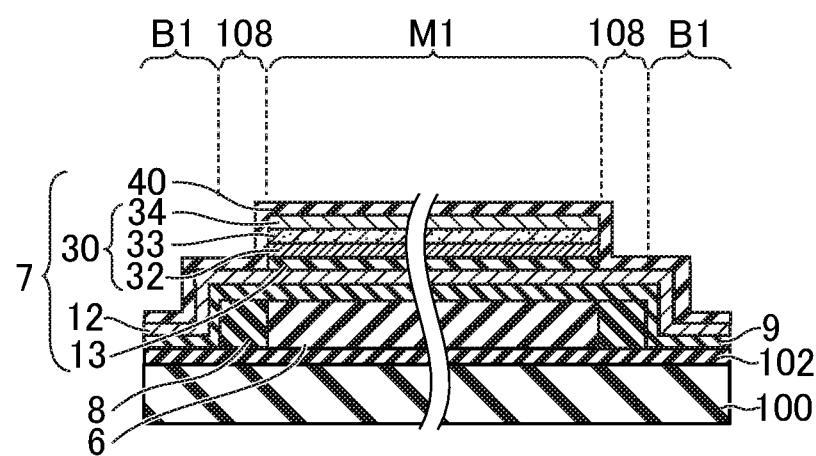
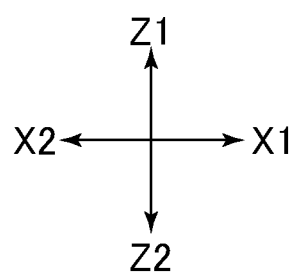

FIG.23
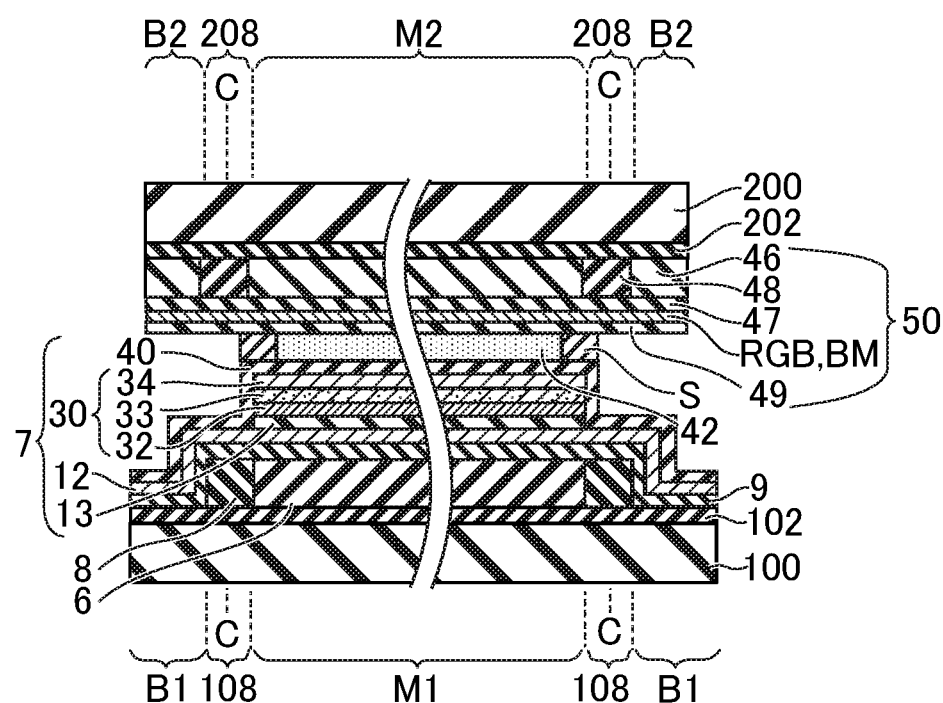
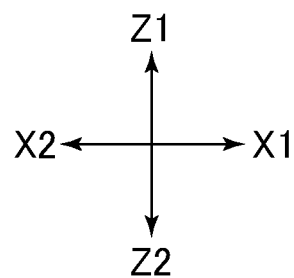

FIG.35
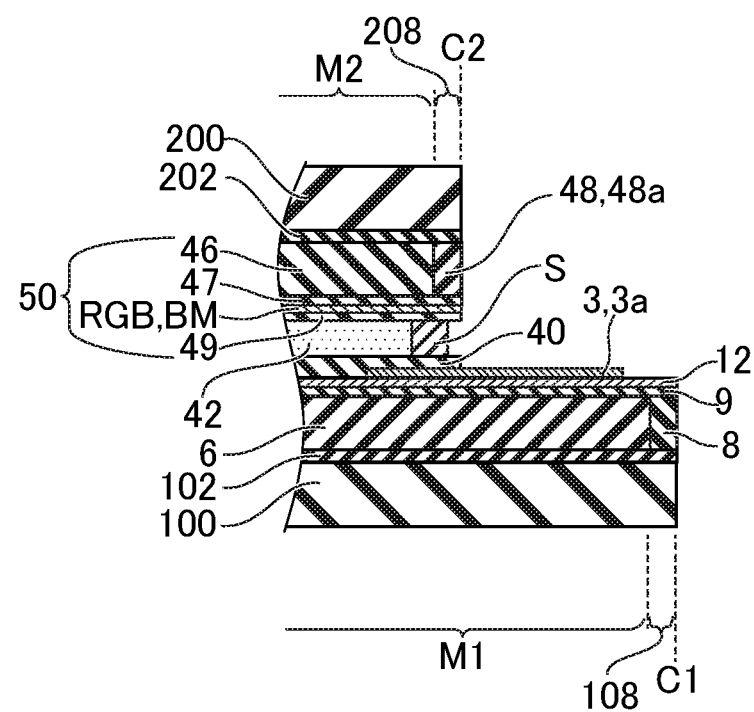
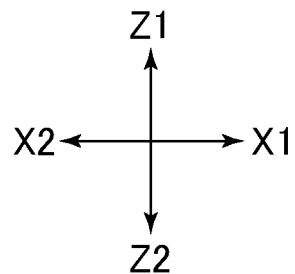

FIG.37
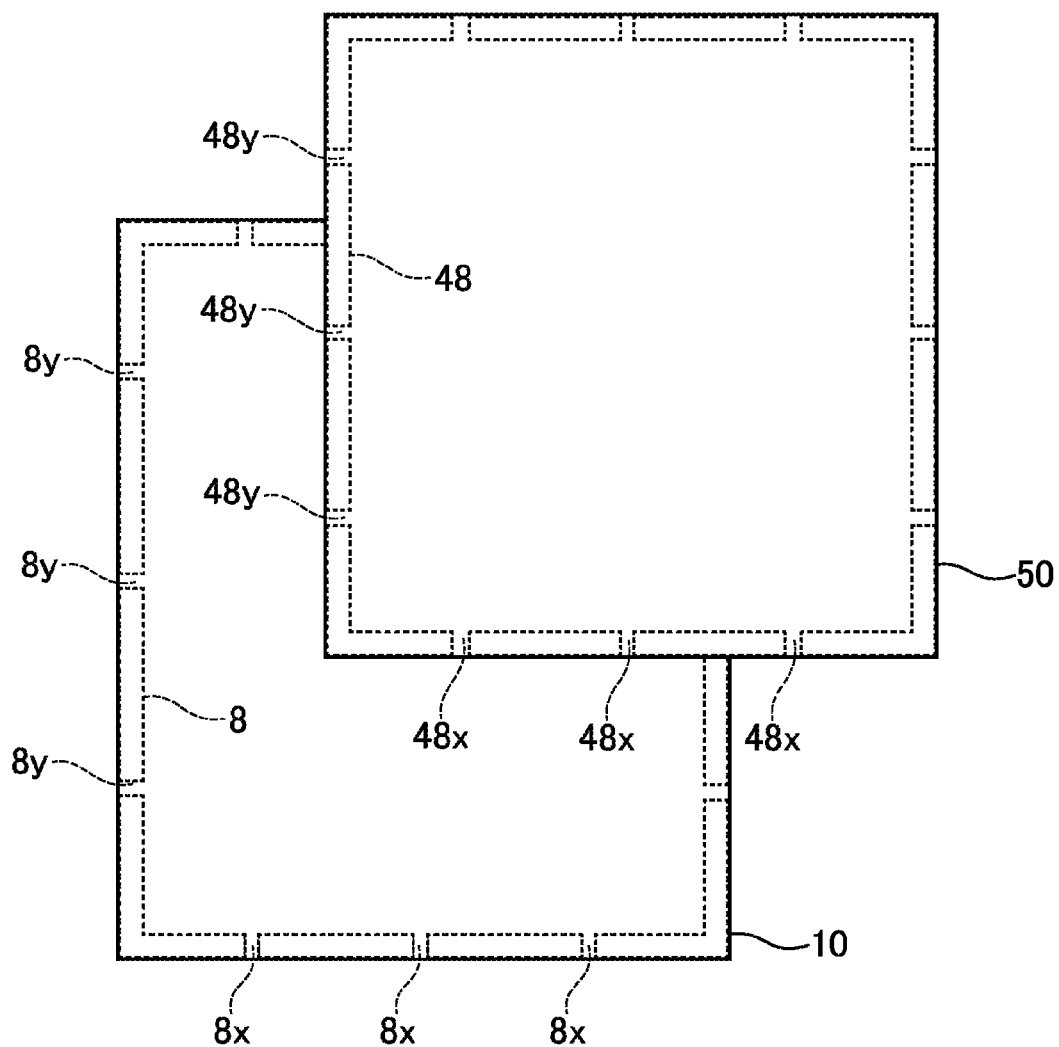
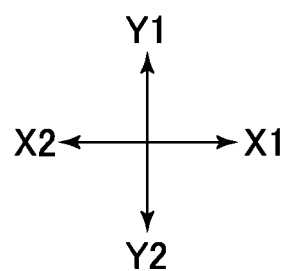

METHOD OF FABRICATING DISPLAY DEVICE RING SHAPE RIB LAYER

CROSS-REFERENCE TO RELATED APPLICATION

The present application claims priority from Japanese application JP2015-157534 filed on Aug. 7, 2015, the content of which is hereby incorporated by reference into this application.

BACKGROUND OF THE INVENTION

1. Field of the Invention

The present invention relates to a display device and a method of manufacturing the same.

2. Description of the Related Art

As display devices used for information communication terminals such as computers or mobile phones, a display device having a pair of substrates is widely used. As such a display device, in recent years, a flexible display device has been developed. Such a display device uses a thin film transistor (TFT) substrate in which TFTs are formed on a flexible resin substrate or a color filter substrate in which color filters are formed on a resin substrate.

Regarding a method of manufacturing a flexible display device, JP2006-185679A discloses a method in which a TFT mother substrate and a counter mother substrate are bonded to each other, and a TFT substrate and a counter substrate are cut for each display region.

In cutting of the TFT substrate and the counter substrate, a method is employed in which, if the substrates are glass substrates, the substrates are broken along grooves formed on surfaces thereof. However, in a case where a resin substrate is laminated on a glass substrate, there is a problem that it is hard to break the substrates.

SUMMARY OF THE INVENTION

An object of the present invention is to provide a manufacturing method capable of easily cutting substrates even if a resin substrate is laminated, and a display device manufactured according to the method.

According to an aspect of the present invention, there is provided a method of manufacturing a display device, including a step of preparing a first glass substrate provided with a plurality of first product regions and first frame regions having shapes respectively surrounding the first product regions; a step of forming first rib layers made of an inorganic material in the first frame regions of the first glass substrate; a step of forming first resin layers in at least the plurality of respective first product regions after forming the first rib layers; a step of forming first functional layers which include light emitting element layers emitting light as a result of luminance of each of a plurality of unit pixels forming an image being controlled and sealing layers covering the light emitting element layers, on the first rib layers and the first resin layers; and a step of cutting the first rib layers and the first functional layers along lines passing through the first frame regions respectively separating the plurality of first product regions while avoiding the plurality of first product regions, in which, in the step of cutting the first rib layers and the first functional layers, at least the first rib layers and the sealing layers are cut.

According to another aspect of the present invention, there is provided a display device including a resin layer; a rib layer that surrounds the resin layer and is made of an inorganic material having a higher level of moistureproof than moistureproof of a material of the resin layer; a functional layer that is formed on an upper surface of the resin layer and the rib layer; and a protection film that covers a lower surface of the resin layer and has a higher level of moistureproof than the moistureproof of the resin layer, in which the functional layer includes a light emitting element layer emitting light as a result of luminance of each of a plurality of unit pixels forming an image being controlled, and a sealing layer covering the light emitting element layer, and inflow the protection film is thicker than the rib layer.

According to the method of manufacturing the display device of the present invention, the first product regions can be separated from each other without cutting the first resin layers.

According to the display device of the present invention, both of the protection film and the rib layer have a higher level of moistureproof than that of the resin layer, but each of the protection film and the rib layer is thicker than the resin layer, and thus it is possible to prevent moisture from permeating in a wide region.

BRIEF DESCRIPTION OF THE DRAWINGS

FIG. 8 is a schematic sectional view taken along the line VIII-VIII in a first rib layer illustrated in FIG. 7.

FIG. 9 is a schematic sectional view for explaining the method of manufacturing the display device according to the first embodiment of the present invention.

FIG. 12 is a schematic sectional view for explaining the method of manufacturing the display device according to the first embodiment of the present invention.

FIG. 13 is a schematic sectional view for explaining the method of manufacturing the display device according to the first embodiment of the present invention.

FIG. 18 is a schematic sectional view for explaining the method of manufacturing the display device according to the first embodiment of the present invention.

FIG. 19 is a schematic sectional view for explaining the method of manufacturing the display device according to the first embodiment of the present invention.

FIG. 22 is a schematic sectional view for explaining the method of manufacturing the display device according to the second embodiment.

FIG. 23 is a schematic sectional view for explaining the method of manufacturing the display device according to the second embodiment.

FIG. 35 is a schematic sectional view for explaining the method of manufacturing the display device according to the embodiment.

FIG. 37 is an exploded plan view of a display device according to a sixth embodiment.

DETAILED DESCRIPTION OF THE INVENTION

Hereinafter, a display device 1 according to a first embodiment of the present invention will be described with reference to the drawings by exemplifying an organic electroluminescent display device. The drawings which are referred to in the following description illustrate feature portions in an enlarged manner for convenience for better understanding of features in some cases, and a dimension ratio or the like of each constituent element is not limited to being the same as actual one.

Figure 1:
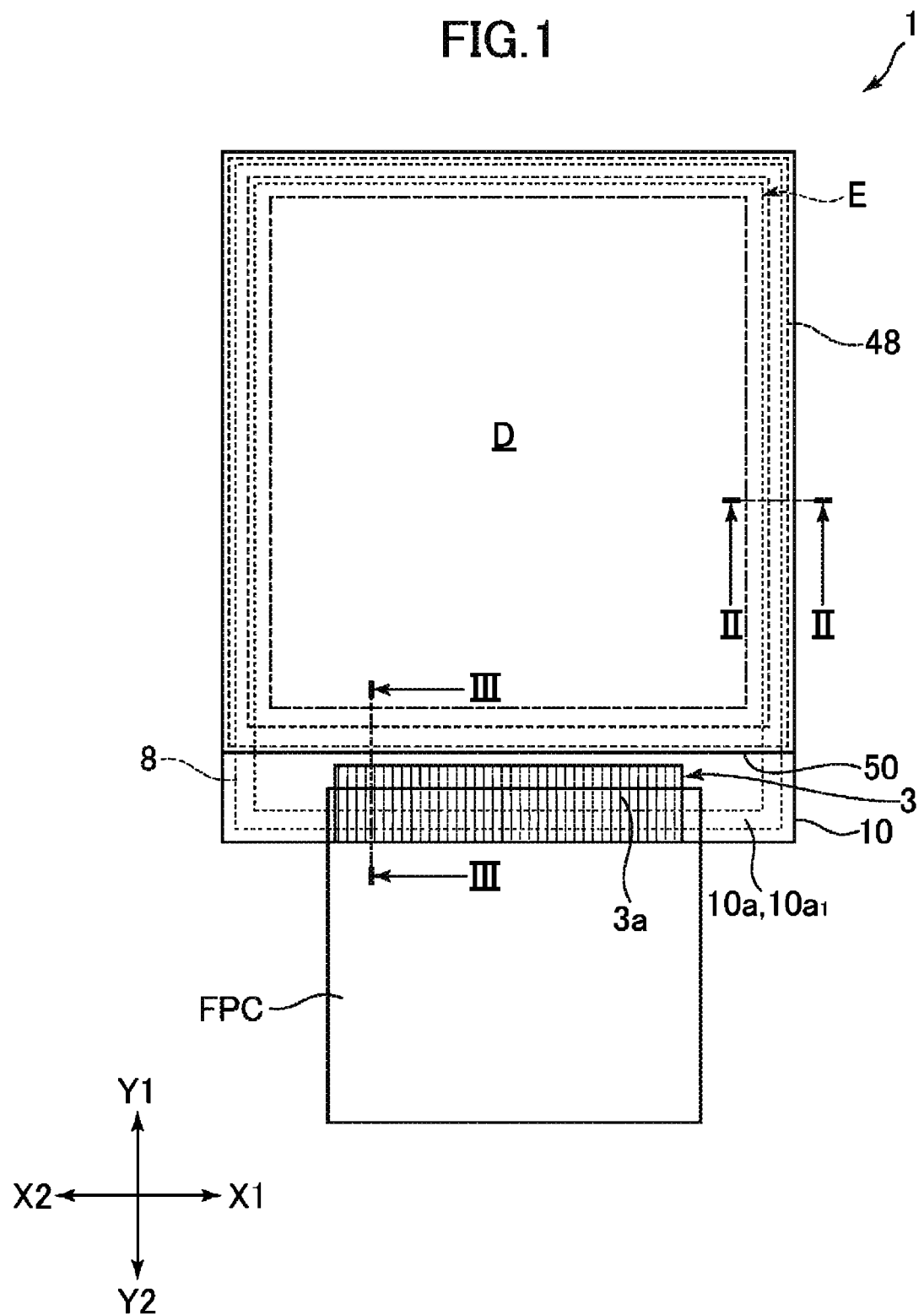
FIG. 1 is a schematic plan view of a display device according to a first embodiment of the present invention.
Figure 2:
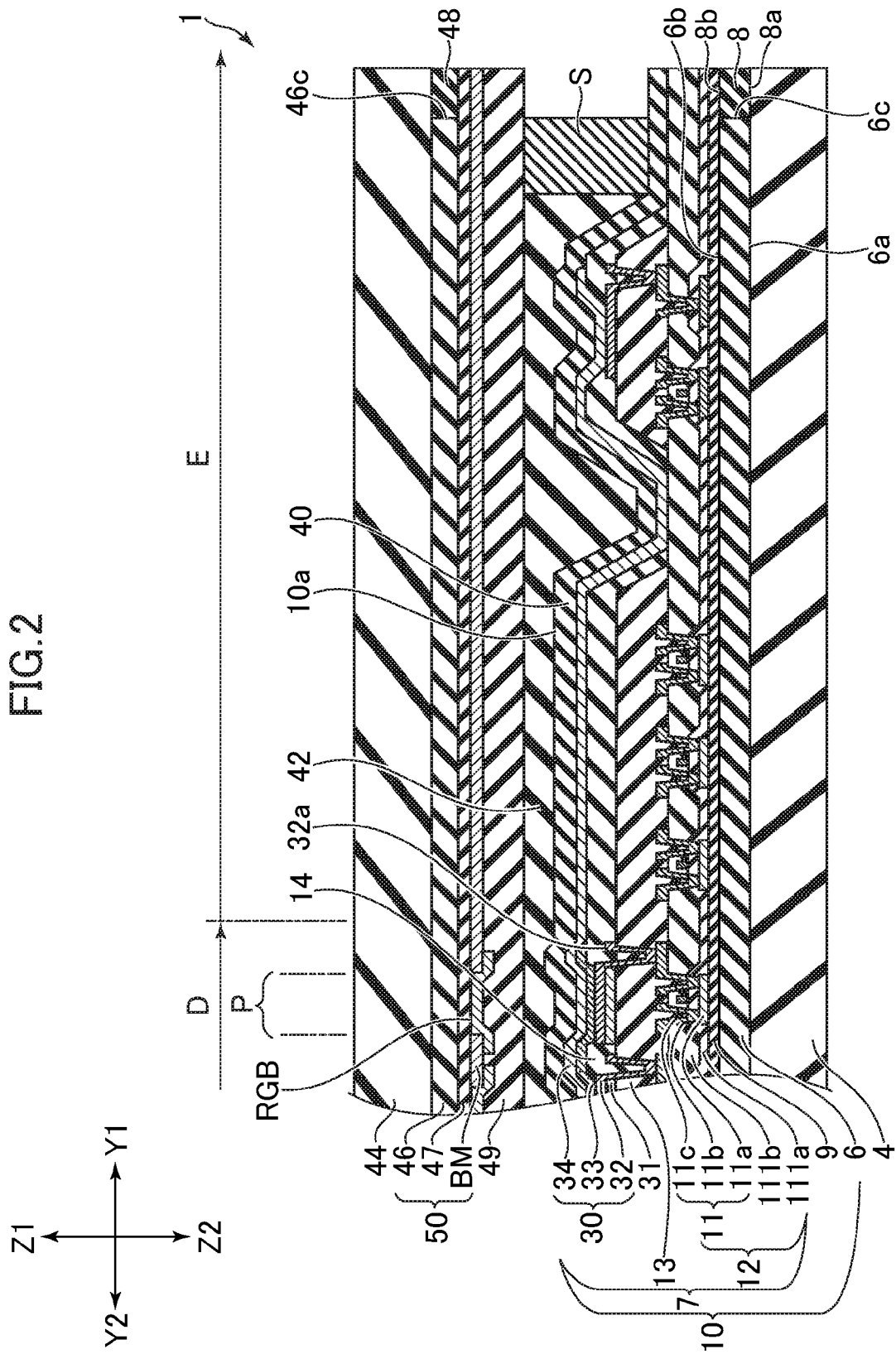
FIG. 2 is a schematic sectional view taken along the line II-II in the display device illustrated in FIG. 1.

Materials and the like exemplified in the following description are only examples, and each constituent element may be made of a material which are different from the materials and may be variously modified within the scope without departing from the spirit thereof. For convenience of description, in the present embodiment, positional relationships among respective constituent elements will be described by using coordinates along an X axis (an X1 direction and an X2 direction), a Y axis (a Y1 direction and a Y2 direction), and a Z axis (a Z1 direction and a Z2 direction). First, a description will be made of a configuration of the display device 1 according to the first embodiment of the present embodiment. FIG. 1 is a schematic plan view of the display device 1 according to the first embodiment of the present invention, and FIG. 2 is a schematic sectional view taken along the line II-II in the display device 1 illustrated in FIG. 1. The "plan view" is a view illustrating a state of being viewed from a direction perpendicular to an upper surface 10a of a TFT substrate 10.

The display device 1 of the present embodiment includes the TFT substrate 10 and a counter substrate 50. As illustrated in FIG. 1, the TFT substrate 10 is divided into a display region D having a plurality of pixels and a peripheral region E which is an outer region of the display region D.

A shape of the TFT substrate 10 in a plan view (a shape viewed from the direction perpendicular to the upper surface 10a) is larger than a shape of the counter substrate 50 in a plan view. Thus, a partial region $10a_1$ (a portion in the Y2 direction in FIG. 1) of the upper surface 10a of the TFT substrate 10 is not covered with the counter substrate 50 and is exposed. A plurality of terminals 3a extending in the Y direction are provided in the region $10a_1$. A terminal portion 3 which is a region where the plurality of terminals 3a are provided is connected to a flexible printed board FPC, and an external apparatus can be connected to the terminal portion 3 via the flexible printed board FPC. An additional terminal portion (not illustrated) may be provided between the terminal portion 3 as a region where the plurality of terminals 3a are provided, and the counter substrate 50, and a semiconductor device for controlling driving of the display device 1 may be mounted on the terminal portion.

Hereinafter, with reference to FIG. 2, details of a configuration of the TFT substrate 10 will be described. The TFT substrate 10 includes a first protection film 4, a first resin layer 6, a first rib layer 8, a first barrier layer 9, and a first functional layer 7. The display region D of the TFT substrate 10 is covered with the counter substrate 50 via an adhesive layer 42.

The first protection film 4 is a flexible film. The first protection film 4 is made of, for example, an organic material such as a polyethylene terephthalate resin, and has a higher level of moistureproof than that of a material of the first resin layer 6. The first protection film 4 covers a lower surface 6a of the first resin layer 6 and a lower surface 8a of the first rib layer 8, and can thus protect the first resin layer 6 from permeation or the like of moisture from the outside. A thickness of the first protection film 4 may be, for example, 0.125 mm, and may be about 0.1 to 0.2 mm.

The first resin layer 6 is a flexible layer, and the first functional layer 7 is formed on an upper surface 6b via the first barrier layer 9. The first resin layer 6 is made of, for example, a flexible resin such as a polyimide resin. A thickness of the first resin layer 6 in the Z direction is 5 μm to 30 μm, and the outside of an outer periphery 6c thereof is surrounded by the first rib layer 8 in a plan view as illustrated in FIGS. 1 and 2.

The first rib layer 8 is a layer covering the outer periphery 6c of the first resin layer 6, and is made of a material having a higher level of moistureproof than that of the first resin layer 6. The outer periphery 6c of the first resin layer 6 is covered with the first rib layer 8, and thus it is possible to prevent moisture from permeating into the first resin layer 6 from the outside. An upper surface 8b of the first rib layer 8 is covered with the first barrier layer 9. The first barrier layer 9 is formed of, for example, SiN or a laminate layer of SiN and SiO. The first rib layer 8 is made of an inorganic insulating material, and is formed of, for example, SiN, SiO, or Ala, or a laminate layer of these materials.

A thickness of the first rib layer 8 in the Z direction is smaller than a thickness of the protection film 4 in the Z direction, and is within the range, for example, from 5 μm to 30 μm. In FIG. 2, a width of the first rib layer 8 in the Y direction is equal to or more than, for example, 0.5 mm. The mechanical strength of the first rib layer 8 is lower than the mechanical strength of the first protection film 4, but the first rib layer 8 absorbs bending force when the display device 1 is bent, and can thus prevent the first protection film 4 from being damaged.

The first functional layer 7 is provided to cover the upper surface 6b of the first resin layer 6 and the upper surface 8b of the first rib layer 8 via the first barrier layer 9. The first functional layer 7 has a circuit layer 12, a planarized film 13, a reflective film 31, an organic electroluminescent element 30, and a sealing layer 40.

The circuit layer 12 includes circuit elements such as thin film transistors 11 and wirings (not illustrated), and insulating layers such as a first insulating film 111a and a second insulating film 111b.

Each of the thin film transistors 11 is a transistor for driving the organic electroluminescent element 30, and is provided for each of a plurality of unit pixels P forming an image. The thin film transistor 11 has, for example, a semiconductor layer 11a, a gate electrode 11b, and a source/drain electrode 11c.

The display region D corresponding to the circuit layer 12 is covered with the insulating planarized film 13. The planarized film 13 is made of, for example, an insulating organic material such as an acrylic resin or a polyimide resin.

The reflective film 31 may be formed in a region corresponding to each unit pixel P on an upper surface of the planarized film 13. The reflective film 31 is a film which reflects light generated from the organic electroluminescent element 30 toward the counter substrate 50 side. The reflective film 31 preferably has high reflectance, and is preferably a metal film made of, for example, aluminum or silver (Ag).

A plurality of organic electroluminescent elements 30 are formed on the planarized film 13. Each of the organic electroluminescent elements 30 has, for example, a lower electrode 32 made of a transmissive and conductive material such as an indium zinc oxide, a light emitting element layer 33 including at least a light emitting layer, and an upper electrode 34 made of a transmissive and conductive material such as an indium zinc oxide.

The lower electrode 32 is an electrode which is formed for each of the plurality of unit pixels P. A drive current is supplied to the lower electrode 32 from the thin film transistor 11 via a contact hole 32a. In a case where the reflective film 31 is made of a conductive material, the reflective film 31 functions as an electrode integrally formed with the lower electrode 32.

A peripheral edge portion of the lower electrode 32 is covered with a pixel isolation film 14. The pixel isolation film 14 is a film which is formed along a boundary between the adjacent unit pixels P so as to isolate the unit pixels P and is made of an organic material.

The light emitting element layer 33 is a layer which has at least a light emitting layer and is made of an organic material. The light emitting element layer 33 in the present embodiment is electrically connected to a circuit element such as the thin film transistor 11 of the circuit layer 12, and thus the luminance of each unit pixel P is control so that light is emitted.

The light emitting element layer 33 has, for example, a hole injection layer, a hole transport layer, a light emitting layer, an electron transport layer, and an electron injection layer (not illustrated) which are laminated in this order from the lower electrode 32 side. A laminate structure of the light emitting element layer 33 is not limited to this example, and may be other structures as long as at least a light emitting layer is included.

The upper electrode 34 is made of a transmissive and conductive material, and is formed to cover an upper surface of the light emitting element layer 33 over a plurality of unit pixels P.

The organic electroluminescent element 30 is covered with the sealing layer 40 over a plurality of unit pixels P. The sealing layer 40 prevents moisture from permeating into the light emitting element layer 33 or the planarized film 13 from an upward direction (the Z1 side in the figure). The sealing layer 40 is made of, for example, silicon nitride (SiN).

The sealing layer 40 is covered with the counter substrate 50 via, for example, the adhesive layer 42. The adhesive layer 42 is a transmissive layer for adhering the TFT substrate 10 and the counter substrate 50 to each other. The counter substrate 50 may be, for example, a color filter substrate with color filters. In a case where the counter substrate 50 is a color filter substrate, the counter substrate 50 includes, for example, a second protection film 44; a second resin layer 46; a second rib layer 48 covering an outer periphery 46c of the second resin layer 46; a second barrier layer 47 covering the second resin layer 46 and the second rib layer 48; black matrices BM provided on a lower surface (a surface on the Z2 side in the figure) of the second resin layer 46 in the display region D in a lattice shape in a plan view; colored layers RGB separated in a matrix by the black matrices BM; and a protection film 49 covering lower surfaces of the colored layers RGB and the black matrices BM.

The second protection film 44, the second resin layer 46, and the second barrier layer 47 or the second rib layer 48 respectively have the same configurations as those of the first protection film 4, the first resin layer 6, and the first barrier layer 9 or the first rib layer 8, and thus detailed description thereof will be omitted.

Figure 3:
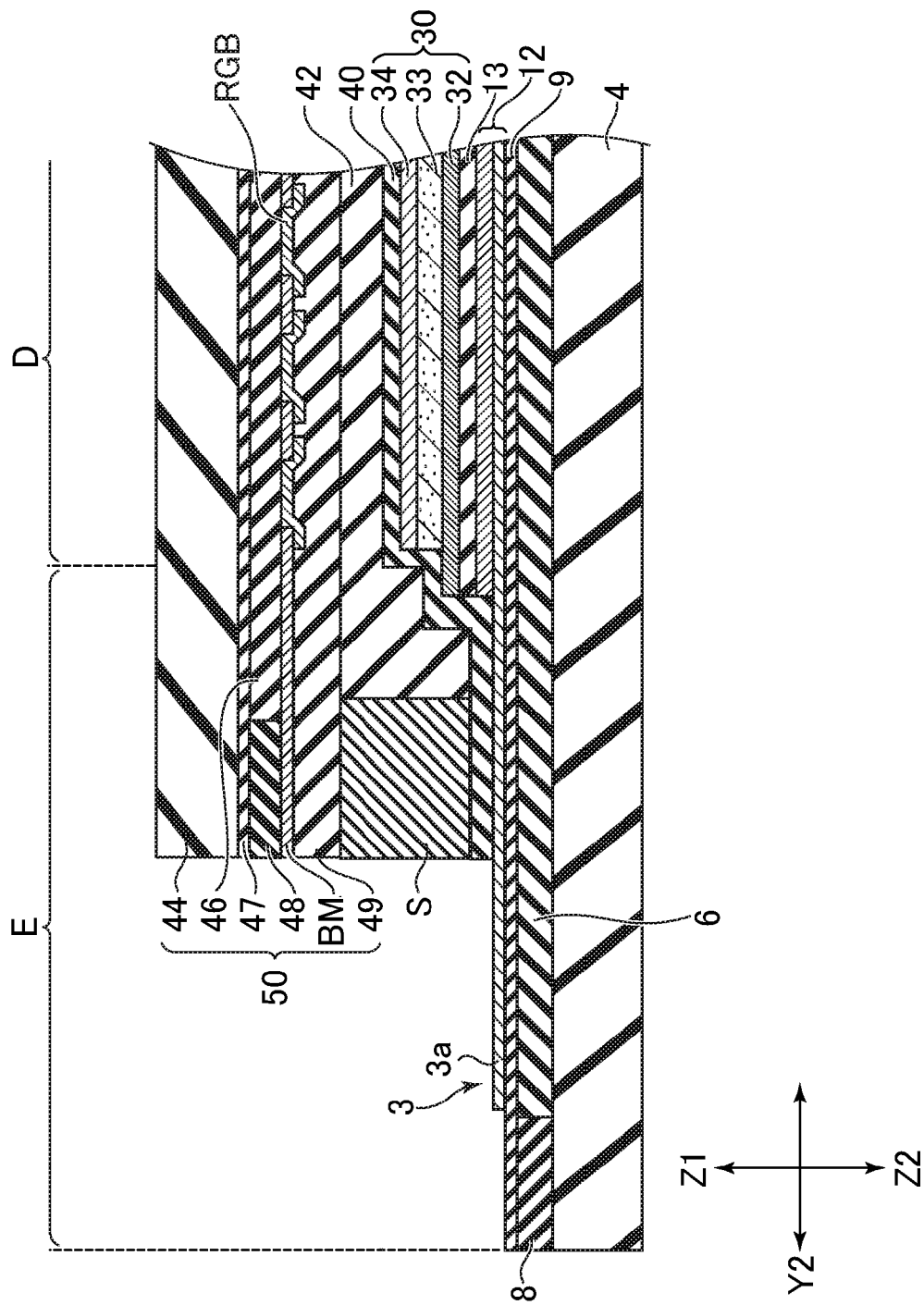
FIG. 3 is a schematic sectional view taken along the line III-III in the display device illustrated in FIG. 1.

Next, a description will be made of a configuration of the terminal portion 3 in the peripheral region E. FIG. 3 is a schematic sectional view taken along the line in the display device 1 illustrated in FIG. 1. In the present embodiment, a portion of the circuit layer 12 exposed out of the sealing layer 40 is set as the terminal 3a, and a region where the terminal 3a is provided is set as the terminal portion 3. The terminal 3a is electrically connected to the circuit layer 12 of the display region D.

Figure 4:
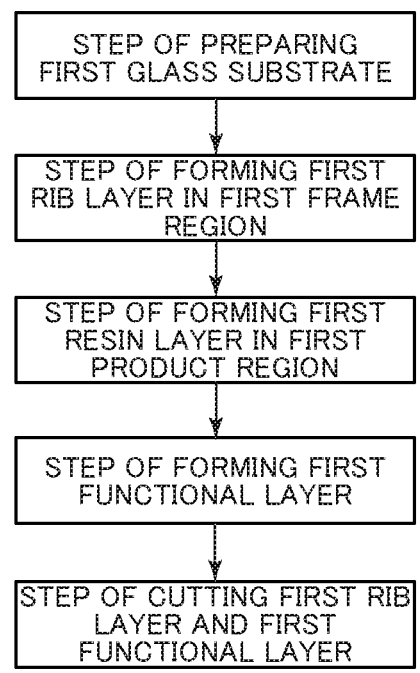
FIG. 4 is a flowchart illustrating a method of manufacturing the display device according to the first embodiment of the present invention.

Next, a description will be made of a method of manufacturing the display device 1. FIG. 4 is a flowchart illustrating a method of manufacturing the display device 1 according to the first embodiment of the present invention. The method of manufacturing the display device 1 of the present embodiment includes a step (FIG. 5) of preparing a first glass substrate 100 provided with a first frame region 108 and a first product region M1; a step (FIG. 6) of forming the first rib layer 8 in the first frame region 108; a step (FIG. 9) of forming the first resin layer 6 in a plurality of first product regions M1; a step (FIG. 10) of forming the first functional layer 7 on the first rib layer 8 and the first resin layer 6; and a step (FIG. 13) of cutting the first rib layer 8 and the first functional layer 7. Hereinafter, each step will be described in detail.

Figure 5:
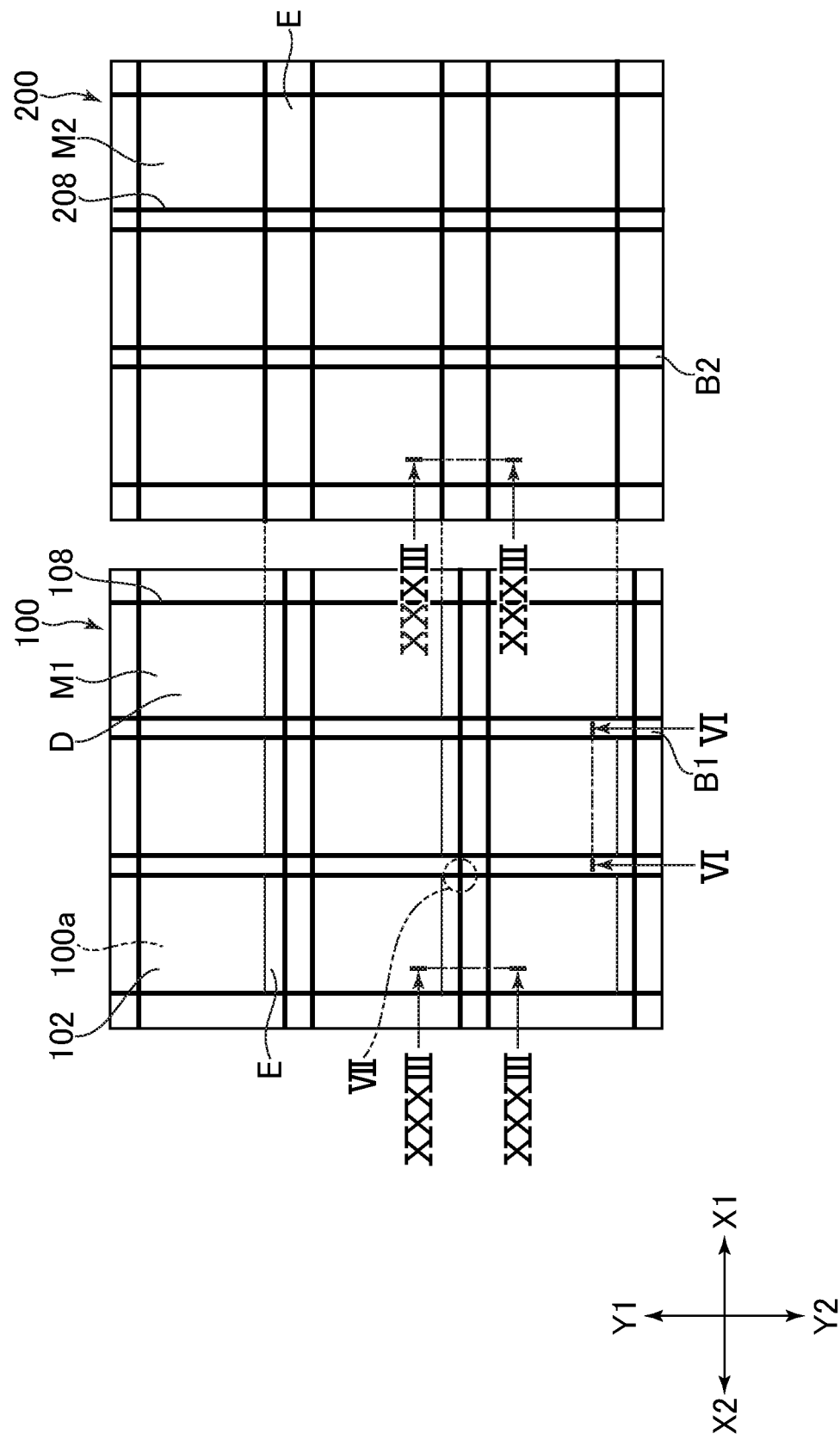
FIG. 5 is a schematic plan view of a first glass substrate and a second glass substrate, illustrating the method of manufacturing the display device according to the first embodiment of the present invention.
Figure 6:
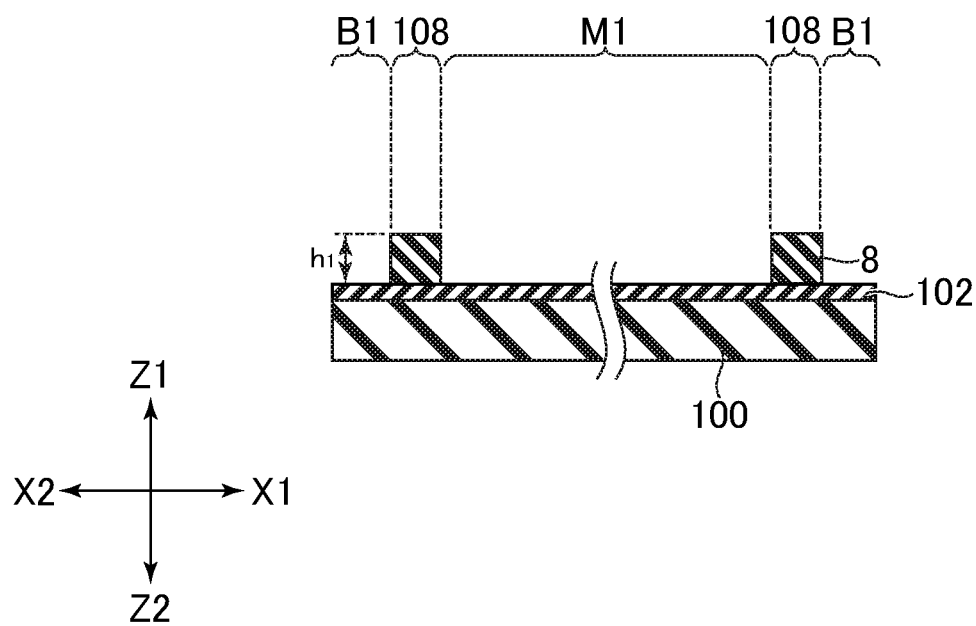
FIG. 6 is a schematic sectional view taken along the line VI-VI in the first glass substrate illustrated in FIG. 5.
Figure 7:
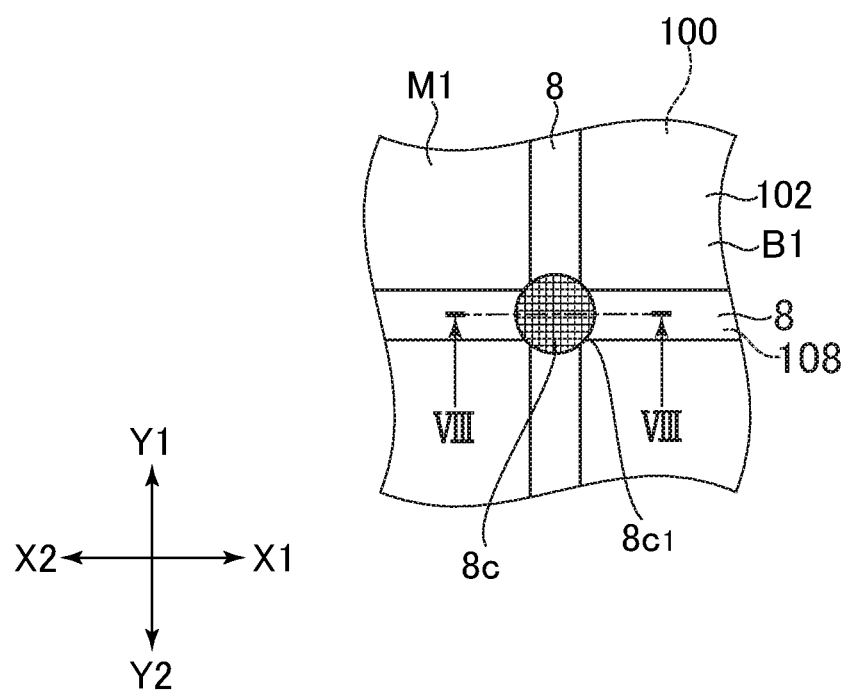
FIG. 7 is a partial enlarged view of a region VII of the first glass substrate illustrated in FIG. 5.
Figure 10:
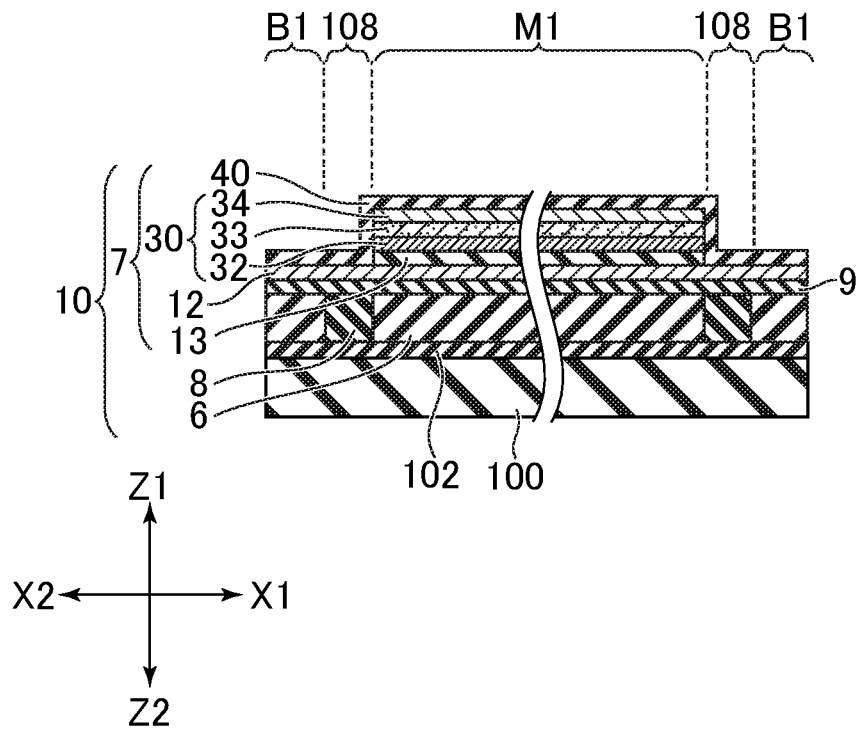
FIG. 10 is a schematic sectional view for explaining the method of manufacturing the display device according to the first embodiment of the present invention.

FIG. 5 is a schematic plan view of the first glass substrate 100 and a second glass substrate 200, for explaining the method of manufacturing the display device 1 according to the first embodiment of the present invention. FIGS. 6, 9 and 10 are schematic sectional views taken along the line VI-VI in the first glass substrate illustrated in FIG. 5, and FIG. 7 is a partial enlarged view of a region VII of the first glass substrate 100 illustrated in FIG. 5. FIGS. 11 to 19 are schematic sectional views in cut surfaces corresponding to the cut line VI-VI in the first glass substrate when the two substrates are finally bonded together. First, the first glass substrate 100 having the first product region M1 and the first frame region 108 is prepared.

The first product region M1 is a region formed on the TFT substrate 10. The first glass substrate 100 in the present embodiment includes a plurality of first product regions M1 in a matrix. A first sacrificial layer 102 is deposited on an upper surface 100a of the first glass substrate 100.

The first frame region 108 is a region surrounding an outer periphery of each first product region M1 in a plan view (a shape viewed from a direction perpendicular to the upper surface 100a of the first glass substrate 100). A width of the first frame region 108 in the X direction is, for example, 1 mm or more, and has a plurality of linear shapes intersecting each other in a plan view. The first rib layer 8 which will be described later is formed in the first frame region 108.

Hereinafter, a region interposed between the first frame regions 108 between the first product regions M1 adjacent to each other will be referred to as a first blank portion B1. The first blank portions B1 surround the outside of the first product region M1. The first frame regions 108 are disposed on both sides of the first blank portion B1.

As illustrated in FIG. 5, the second glass substrate 200 is prepared. The second glass substrate 200 has a plurality of second product regions M2 and second frame regions 208 in the same manner as the first glass substrate 100.

The second product regions M2 are regions on the counter substrate 50. If the second glass substrate 200 overlaps the first glass substrate 100, the second product regions M2 are disposed in a matrix so as to correspond to and overlap the first product regions M1.

Each of the second frame regions 208 is a region in which the second rib layer 48 is formed. The second frame regions 208 surround an outer periphery of the second product region M2 in a plan view. An outer periphery of the second frame region 208 is surrounded by second blank portions B2.

Next, as illustrated in FIG. 6, the first rib layers 8 made of an inorganic material are formed on the first sacrificial layer 102.

As illustrated in FIG. 7, the first rib layers 8 are formed on the first sacrificial layer 102 in the first frame regions 108, and thus the first rib layers 8 have a shape in a plan view extending along a plurality of lines intersecting each other in the same manner as the first frame regions 108. The linear portion of the first rib layer 8 extending in the X direction and the linear portion thereof in the Y direction intersect each other at an intersection 8c.

A method of forming the first rib layer 8 may be well-known methods such as a screen printing method or a photolithography method. As a material of the first rib layer 8, for example, SiO may be used. A height h1 of the first rib layer 8 in the Z direction may be appropriately adjusted within the range, for example, from 5 μm to 30 μm so as to correspond to a thickness of the first resin layer 6 which will be described later.

Next, as illustrated in FIGS. 7 and 8, a protection portion 8c1 is formed on the intersection 8c. FIG. 8 is a schematic sectional view taken along the line VIII-VIII in the first rib layer 8 illustrated in FIG. 7. For convenience of description, in FIG. 8, the first glass substrate 100 and the first sacrificial layer 102 are not illustrated.

The protection portion 8c1 is a member which is provided in order to prevent a thickness h2 of the first rib layer 8 at the intersection 8c in the Z direction from becoming smaller than the thickness h1 of the first rib layer 8 at other locations in the Z direction in the steps which will be described later.

The protection portion 8c1 is made of the same material as that of the first rib layer 8, but may be made of other materials as long as the protection portion 8c1 can be broken. The protection portion 8c1 is formed on the intersection 8c in the above-described way, and thus the thickness h2 of the portion located at the intersection 8c is larger than the thickness h1 of other portions.

Next, as illustrated in FIG. 9, for example, a liquid polyimide resin is coated on the first product region M1 of the first sacrificial layer 102. Next, the polyimide resin is cured, and thus the first resin layer 6 is formed.

The first resin layer 6 may be formed according to other methods as long as at least each of a plurality of first product regions M1 can be formed. For example, a sheet-like resin layer may be stuck to each of the first product regions M1.

In a case where the first resin layer 6 is formed by coating the liquid polyimide resin, a residual polyimide resin may be stuck onto the first rib layer 8. In this case, the first resin layer 6 formed on the first rib layer 8 is removed.

Referring to FIGS. 7 and 8 again, a method of removing the first resin layer 6 will be described. A laser device is preferably used to remove the first resin layer 6 on the first rib layer 8. Specifically, scanning and irradiation with laser light may be performed along the first rib layer 8. Details thereof will be described later with reference to FIG. 31. At this time, the intersection 8c is irradiated with the laser light for a longer period of time than other portions, but the protection portion 8c1 is formed thereat, and thus the thickness h2 of the intersection 8c is prevented from being smaller than the thickness h1 of other portions.

Since the thickness h2 of the intersection 8c is not reduced as mentioned above, it is possible to prevent the intersection 8c from being damaged in the manufacturing steps of the display device 1.

Next, as illustrated in FIG. 10, the first functional layer 7 is formed on the first resin layer 6 and the first rib layer 8. First, the first barrier layer 9 is formed on the first resin layer 6 and the first rib layer 8. Next, the circuit layer 12 including circuit elements such as thin film transistors and wirings is formed on the first barrier layer 9. The circuit elements are assumed to include terminals or wirings for electrical connection to an external device. Next, the planarized film 13 made of an insulating organic material is formed to cover the circuit layer 12 in the display region D.

Next, the organic electroluminescent element 30 is formed for each unit pixel P in the display region D corresponding to each first product region M1.

Next, the sealing layer 40 is formed to cover the first product regions M1, the first frame regions 108, and the first blank portions B1. The sealing layer 40 is formed to cover the upper surface of the first rib layer 8 in the first frame region 108.

As illustrated in FIG. 3, the planarized film 13 and the organic electroluminescent element 30 are not formed on a part of the circuit layer 12 in the non-display region E, and thus the part of the circuit layer 12 in the non-display region E is covered with the sealing layer 40.

In the above-described manner, the TFT substrate 10 is formed on the first glass substrate 100.

Figure 11:
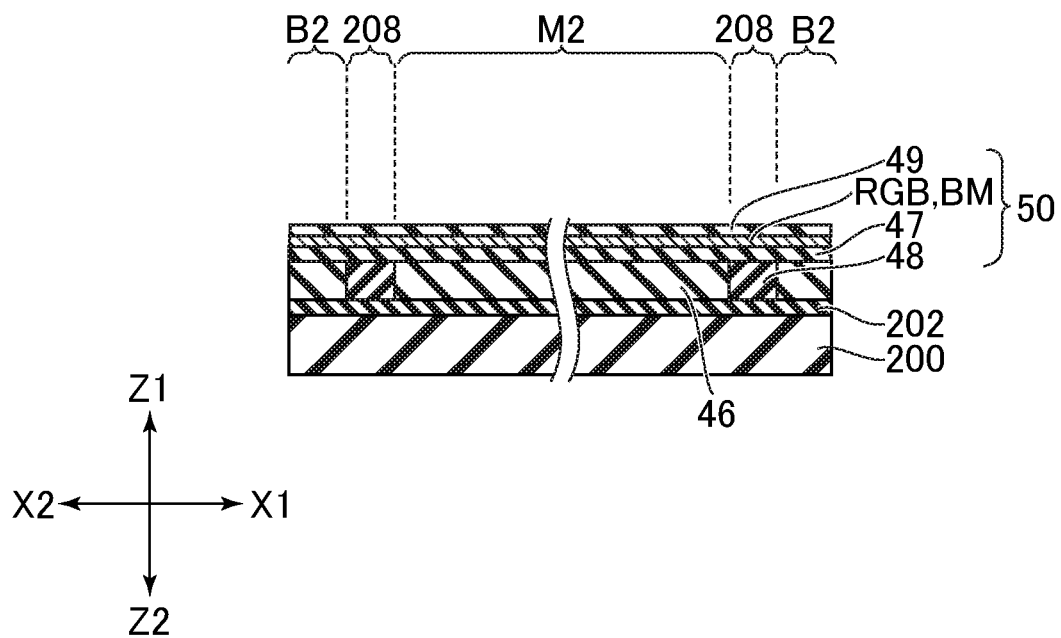
FIG. 11 is a schematic sectional view for explaining the method of manufacturing the display device according to the first embodiment of the present invention.

As illustrated in FIG. 11, the second glass substrate 200 provided with the counter substrate 50 is prepared.

The second resin layer 46 is provided on the second glass substrate 200 via a second sacrificial layer 202, and the second rib layers 48 are formed in second frame regions 208 via the second sacrificial layer 202. A second blank portion B2 interposed between the adjacent second frame regions 208 is provided between the adjacent second product regions M2 (refer to FIG. 5).

The colored layer RGB and the black matrix BM separating the colored layer RGB for each unit pixel P are formed on the second resin layer 46 via the second barrier layer 47, and the protection film 49 is formed on the colored layer RGB and the black matrix BM.

Next, as illustrated in FIG. 12, the counter substrate 50 formed on the second glass substrate 200 is bonded to the first functional layer 7 formed on the first glass substrate 100.

A liquid resin is coated on the sealing layer 40 in each first product region M1 by, for example, a dispenser, and thus the adhesive layer 42 is prepared. Prior thereto, a seal layer S is prepared in a region surrounding an outer periphery of the adhesive layer 42 in a plan view. The seal layer S is provided at a position which avoids a line C for cutting the first rib layer 8, the first barrier layer 9, the circuit layer 12, and the sealing layer 40 in the steps which will be described later. The seal layer S is disposed further toward the first product region M1 and the second product regions M2 side than the line C so as not to overlap the line C. Thus, the seal layer S is formed inside of the second rib layer 48. The seal layer S and the second rib layer 48 may partially overlap each other in a plan view. Similarly, the seal layer S is formed inside the first rib layer 8. The seal layer S and the first rib layer 8 may partially overlap each other in a plan view. The seal layer S and the first rib layer 8 are provided in a form of being separated from each other in order for the terminal portion 3 to be disposed on the side where the terminal portion 3 is disposed.

Materials of the adhesive layer 42 and the seal layer S are not particularly limited as long as the first functional layer 7 can be adhered to the counter substrate 50.

Next, the counter substrate 50 is bonded onto the adhesive layer 42 and the seal layer S so that at least a part of the first rib layer 8 and at least a part of the second rib layer 48 overlap each other in a plan view.

Successively, as illustrated in FIG. 13, the first glass substrate 100, the first sacrificial layer 102, the first rib layer 8, at least the sealing layer 40 corresponding to the first functional layer 7, the counter substrate 50, the portion of the second rib layer 48 overlapping the first rib layer 8, the second sacrificial layer 202, and the second glass substrate 200 are cut along the line C passing through the first frame region 108 and the second frame regions 208 (FIG. 12) while avoiding a plurality of first product regions M1 and second product regions M2.

Consequently, the first glass substrate 100 and the second glass substrate 200 are separated for each of regions including the plurality of first product regions M1 and second product regions M2.

As mentioned above, since the location where the first rib layer 8 overlaps the second rib layer 48 is cut while avoiding the flexible first resin layer 6 and second resin layer 46, even the display device having the flexible TFT substrate 10 or counter substrate 50 can be easily separated for each of regions including the first product regions M1 and the second product regions M2.

The seal layer S in the present embodiment is disposed at the position avoiding the line C, and thus the adhesive seal layer S can be prevented from being cut.

Figure 14:
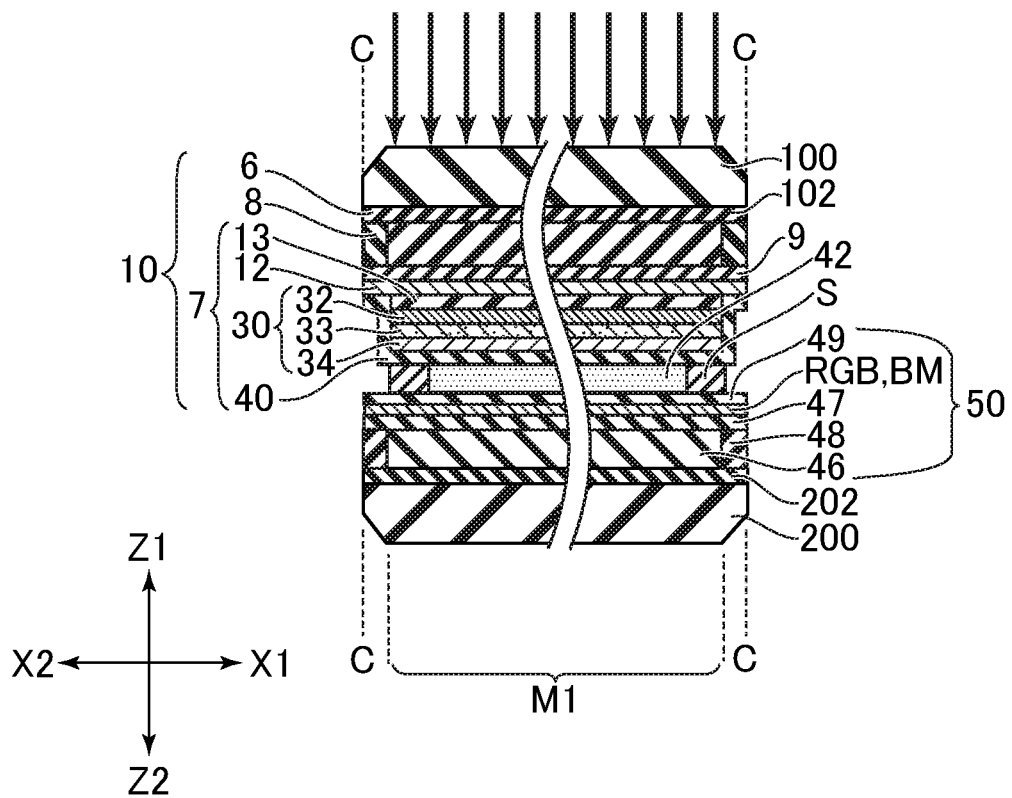
FIG. 14 is a schematic sectional view for explaining the method of manufacturing the display device according to the first embodiment of the present invention.
Figure 15:
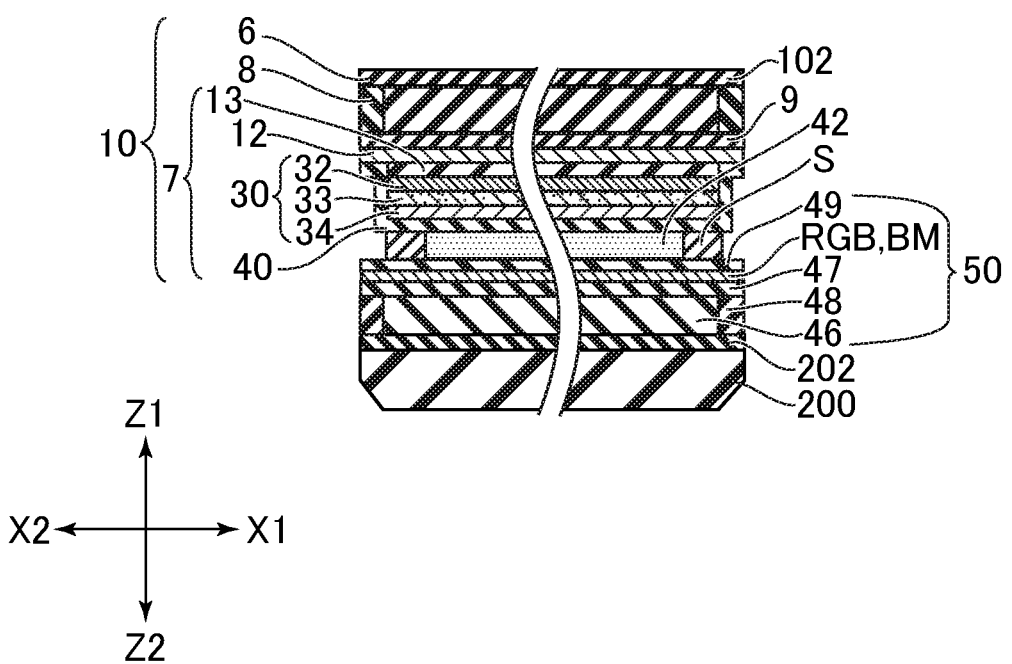
FIG. 15 is a schematic sectional view for explaining the method of manufacturing the display device according to the first embodiment of the present invention.

Next, as illustrated in FIG. 14, the first sacrificial layer 102 is irradiated with, for example, laser light so that the first glass substrate 100 is peeled from the first sacrificial layer 102 as illustrated in FIG. 15. Consequently, the first glass substrate 100 is peeled from the first resin layer 6 and the first rib layer 8. In the example illustrated in FIG. 15, the first glass substrate 100 is peeled from the first sacrificial layer 102, but, as a modification example, the first sacrificial layer 102 may be peeled from the first resin layer 6 along with the first glass substrate 100. Consequently, the first sacrificial layer 102, or the first resin layer 6 and the first rib layer 8 are exposed.

The first resin layer 6 and the first rib layer 8 are formed on the first glass substrate 100 via the first sacrificial layer 102, and thus the first glass substrate 100 can be easily peeled from the first resin layer 6 and the first rib layer 8, or the first sacrificial layer 102. Therefore, the first functional layer 7 can be prevented from being damaged, and thus defects can be prevented from being generated in the first functional layer 7 when the first resin layer 6 and the first rib layer 8 are peeled from the first glass substrate 100.

Since the first resin layer 6 is formed on the first glass substrate 100, even if the first resin layer 6 is flexible, the first functional layer 7 can be formed thereon.

Figure 16:
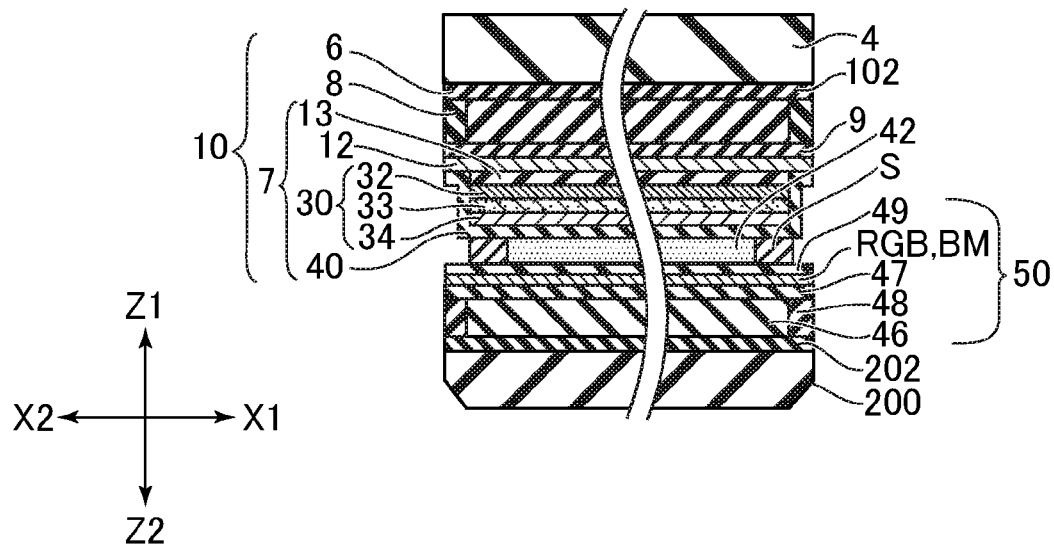
FIG. 16 is a schematic sectional view for explaining the method of manufacturing the display device according to the first embodiment of the present invention.

Next, as illustrated in FIG. 16, the first protection film 4 is stuck to a surface of the layer (the first sacrificial layer 102, or the first resin layer 6 and the first rib layer 8) from which the first glass substrate 100 is peeled. The first protection film 4 is stuck instead of the first glass substrate 100, and thus the first resin layer 6 and the first functional layer 7 are protected from stress which is externally applied or permeation of moisture.

Figure 17:
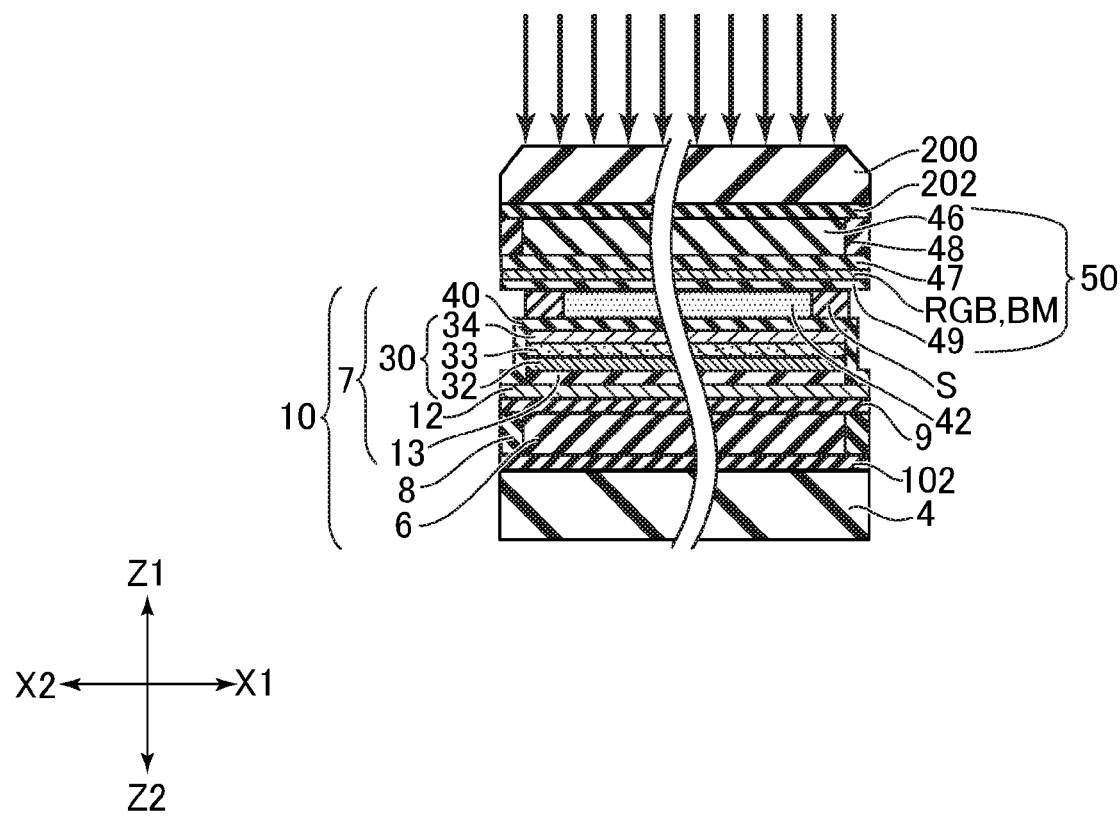
FIG. 17 is a schematic sectional view for explaining the method of manufacturing the display device according to the first embodiment of the present invention.

FIG. 17 is a schematic sectional view for explaining the method of manufacturing the display device 1 according to the first embodiment of the present embodiment, and FIG. 18 is a schematic sectional view for explaining the method of manufacturing the display device 1 according to the first embodiment of the present embodiment.

The second sacrificial layer 202 is irradiated with, for example, laser light, so that the second glass substrate 200 is peeled from the second sacrificial layer 202. Consequently, the second glass substrate 200 is peeled from the second resin layer 46 and the second rib layer 48. In the example illustrated in FIG. 17, the second glass substrate 200 is peeled from the second sacrificial layer 202, but, as a modification example, the second sacrificial layer 202 may be peeled from the second resin layer 46 along with the second glass substrate 200. Consequently, the second sacrificial layer 202, or the second resin layer 46 and the second rib layer 48 are exposed.

As mentioned above, the second resin layer 46 and the second rib layer 48 are formed on the second glass substrate 200 via the second sacrificial layer 202, and thus the second glass substrate 200 can be easily peeled from the second resin layer 46 and the second rib layer 48, or the second sacrificial layer 202. Consequently, defects can be prevented from being generated when the second resin layer 46 and the second rib layer 48 are peeled from the second glass substrate 200.

As mentioned above, since the second glass substrate 200 is peeled after the second resin layer 46 is formed on the second glass substrate 200 in advance, even if the second resin layer 46 is flexible, the colored layer RGB can be formed thereon.

Next, as illustrated in FIG. 19, the second protection film 44 is stuck to a surface of the layer (the second sacrificial layer 202, or the second resin layer 46 and the second rib layer 48) from which the second glass substrate 200 is peeled. The second protection film 44 is stuck in the above-described manner, and thus the second resin layer 46 and a color filter RGM are protected from stress which is externally applied or permeation of moisture. The first sacrificial layer 102 and the second sacrificial layer 202 are made of an inorganic material such as amorphous silicon, polysilicon, or Mo, and each thereof is thinner than each of the first protection film 4, the second protection film 44, the first resin layer 6, and the second resin layer 46.

In the method of manufacturing the display device 1 according to the present embodiment, the first rib layer 8 made of an inorganic material is formed to surround the outer periphery of the first product region M1 (first resin layer 6), and the location where the first rib layer 8 overlaps the second rib layer 48 is cut along the line C passing through the first frame region 108 while avoiding the first product region M1.

The first rib layer 8 made of an inorganic material is less flexible than the first resin layer 6, and thus even the first glass substrate 100 provided with the flexible first resin layer 6 can be easily cut for each first product region M1 compared with a manufacturing method not using the present configuration.

Next, a description will be made of a method of manufacturing a display device (electroluminescent display device) according to a second embodiment. FIGS. 20 to 24 are schematic sectional views for explaining a method of manufacturing the display device according to the second embodiment. The schematic sectional views are also schematic sectional views in cut surfaces corresponding to the cut line VI-VI in a first glass substrate when substrates are finally bonded to each other.

The method of manufacturing the display device according to the present embodiment is different from the method in the first embodiment in that the first resin layer 6 has a sheet form. Hereinafter, steps which are different from the steps of the method of manufacturing the display device 1 in the first embodiment will be described, and detailed description of the same steps will be omitted.

Figure 20:
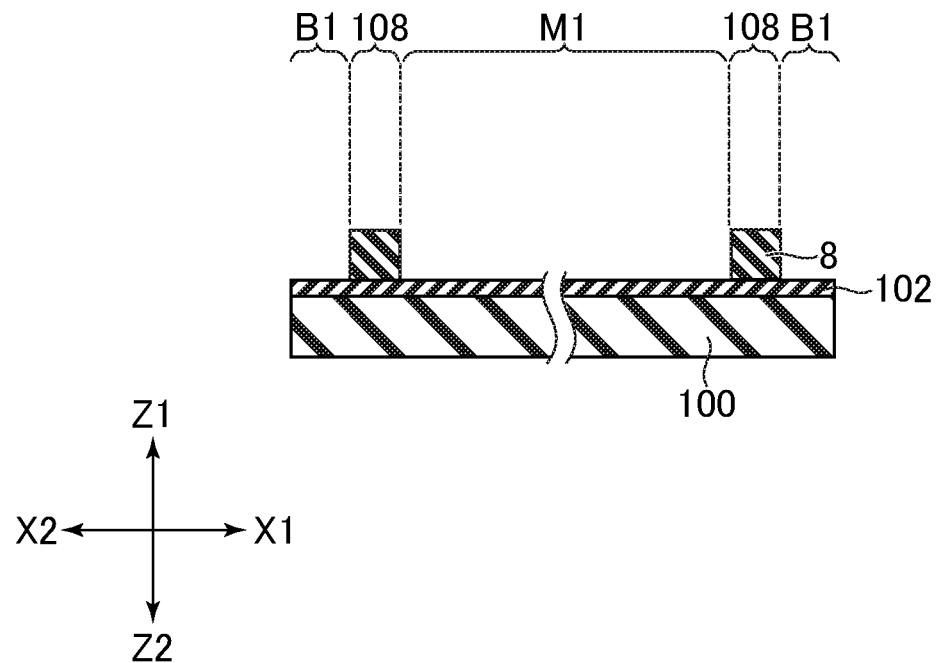
FIG. 20 is a schematic sectional view for explaining a method of manufacturing a display device according to a second embodiment.

As illustrated in FIG. 20, first, the first glass substrate 100 provided with the first sacrificial layer 102 and the first rib layer 8 is prepared. Next, the sheet-like first resin layer 6 is prepared. The first resin layer 6 has a shape corresponding to the first product region M1 in a plan view.

Figure 21:
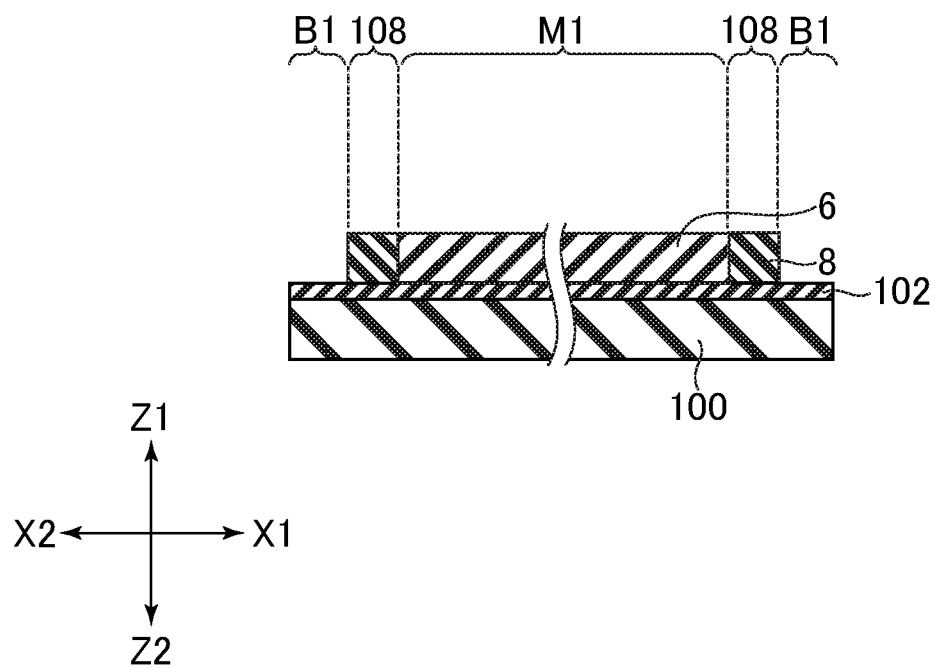
FIG. 21 is a schematic sectional view for explaining the method of manufacturing the display device according to the second embodiment.

As illustrated in FIG. 21, next, the sheet-like first resin layer 6 is disposed on the first product region M1 corresponding to the first sacrificial layer 102. The first resin layer 6 in the present embodiment has a plan-view shape corresponding to the first product region M1, and thus the first resin layer 6 is disposed to avoid the first blank portion B1.

As illustrated in FIG. 5, since the first blank portion B1 is disposed between the adjacent first frame regions 108, adjacent first resin layers 6 can be disposed in the respective first product regions M1 without overlap each other.

As illustrated in FIG. 22, next, the first functional layer 7 is formed on the first resin layer 6 and the first rib layer 8 via the first barrier layer 9.

As illustrated in FIG. 23, the counter substrate 50 is bonded onto the first functional layer 7 via the adhesive layer 42 and the seal layer S so that at least a part of the first rib layer 8 and at least a part of the second rib layer 48 overlap each other in a plan view.

Next, the first glass substrate 100, the first rib layer 8, the location where the first rib layer 8 and the second rib layer 48 overlap each other, and the second glass substrate 200 are cut, and thus the first glass substrate 100 and the second glass substrate 200 are separated for each of regions including the first product regions M1 and the second product regions M2.

Figure 24:
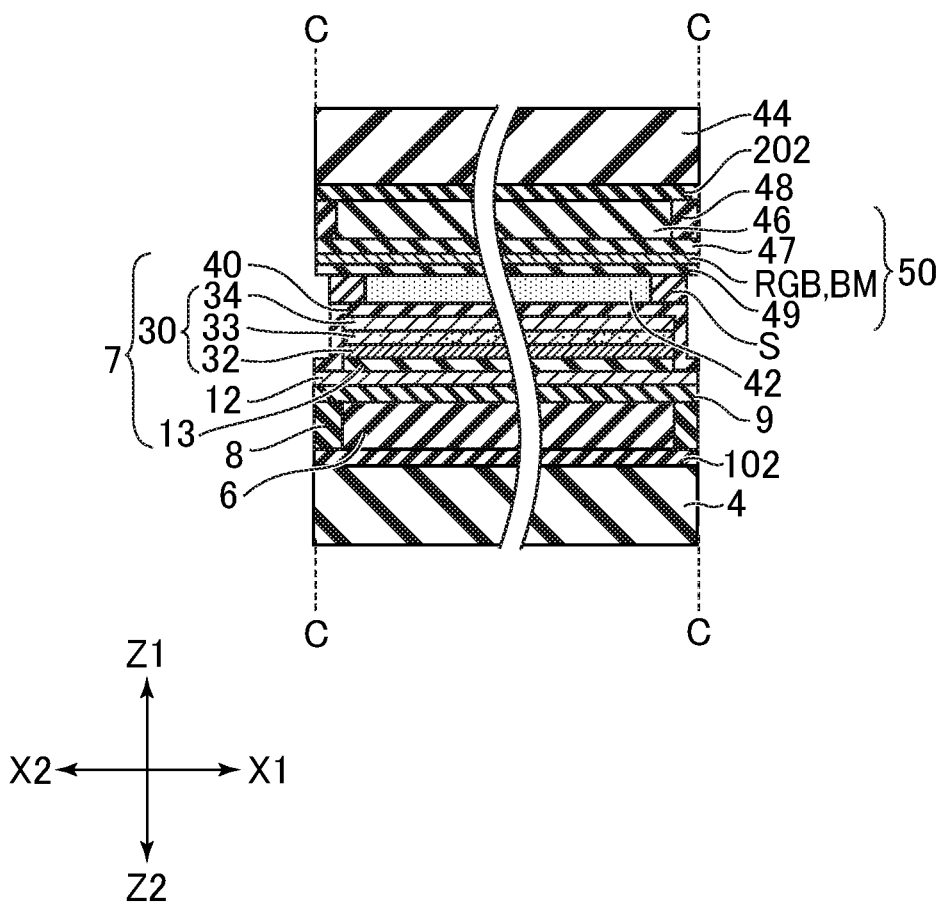
FIG. 24 is a schematic sectional view for explaining the method of manufacturing the display device according to the second embodiment.

As illustrated in FIG. 24, the first glass substrate 100 and the second glass substrate 200 are respectively peeled from the first resin layer 6 and the second resin layer 46, and the first protection film 4 and the second protection film 44 are stuck thereto. Through the above-described steps, the display device according to the second embodiment is manufactured.

Next, a description will be made of a method of manufacturing a display device according to a third embodiment. FIGS. 25 to 28 are schematic sectional views for explaining a method of manufacturing the display device according to the third embodiment. The schematic sectional views are also schematic sectional views in cut surfaces corresponding to the cut line VI-VI in a first glass substrate when substrates are finally bonded to each other.

The method of manufacturing the display device according to the present embodiment is different from the method in the first embodiment in that the colored layers RGB, the black matrices BM, and the protection film 49 are directly formed on the second glass substrate 200, the second rib layer 48, the second resin layer 46, and the second sacrificial layer are not used, and the second glass substrate 200 is polished to be thinned. Hereinafter, steps which are different from the steps of the method of manufacturing the display device 1 in the first embodiment will be described, and detailed description of the same steps will be omitted.

Figure 25:
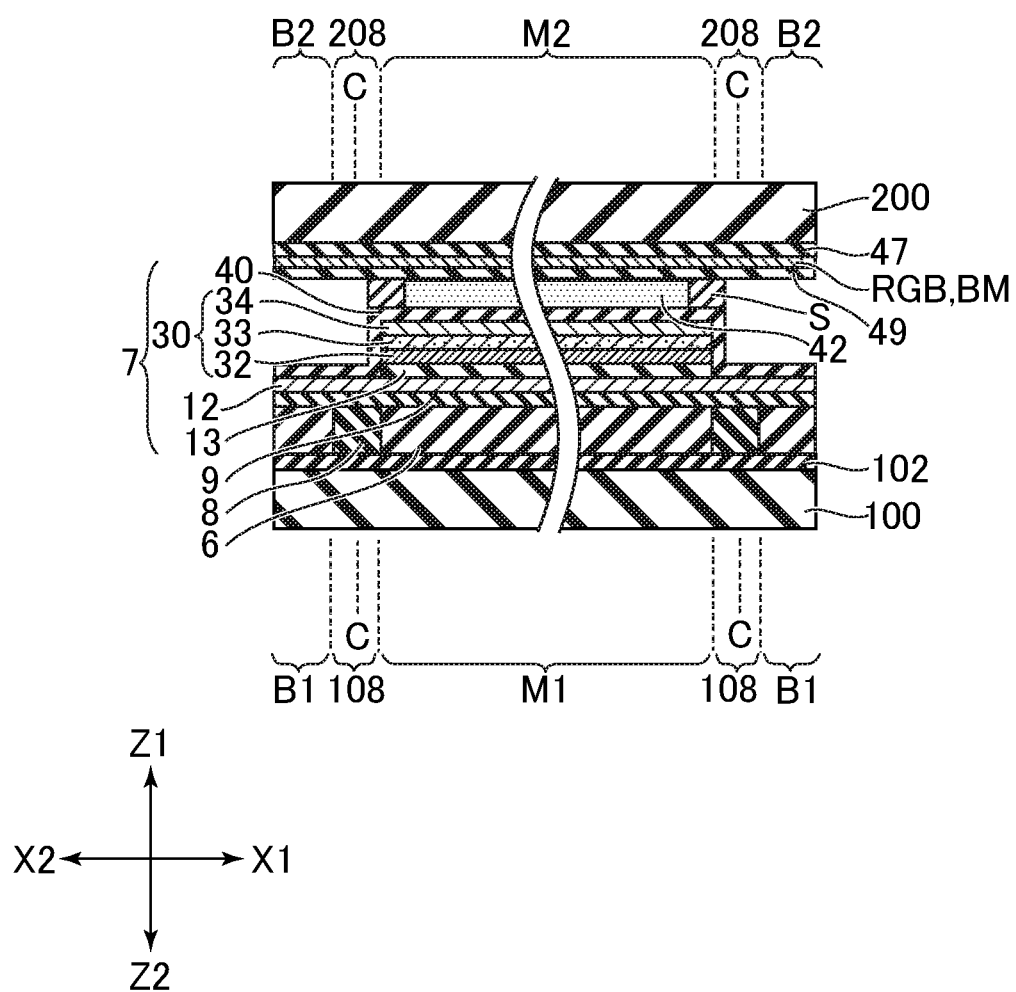
FIG. 25 is a schematic sectional view for explaining a method of manufacturing a display device according to a third embodiment.

As illustrated in FIG. 25, the first glass substrate 100 and the second glass substrate 200 are prepared in a state of being bonded together. The first sacrificial layer 102, the first barrier layer 9, the first resin layer 6, the first rib layer 8, and the first functional layer 7 are formed in advance on the first glass substrate 100.

The second sacrificial layer, the second resin layer, and the second rib layer are not formed on the second glass substrate 200 of the present embodiment, and the colored layer RGB, the black matrix BM, and the protection film 49 are directly formed on the second glass substrate 200 via the second barrier layer 47.

In the present embodiment, the protection film 49 formed on the second glass substrate 200 is stuck onto the first functional layer 7 formed on the first glass substrate 100 via the adhesive layer 42 and the seal layer S.

Figure 26:
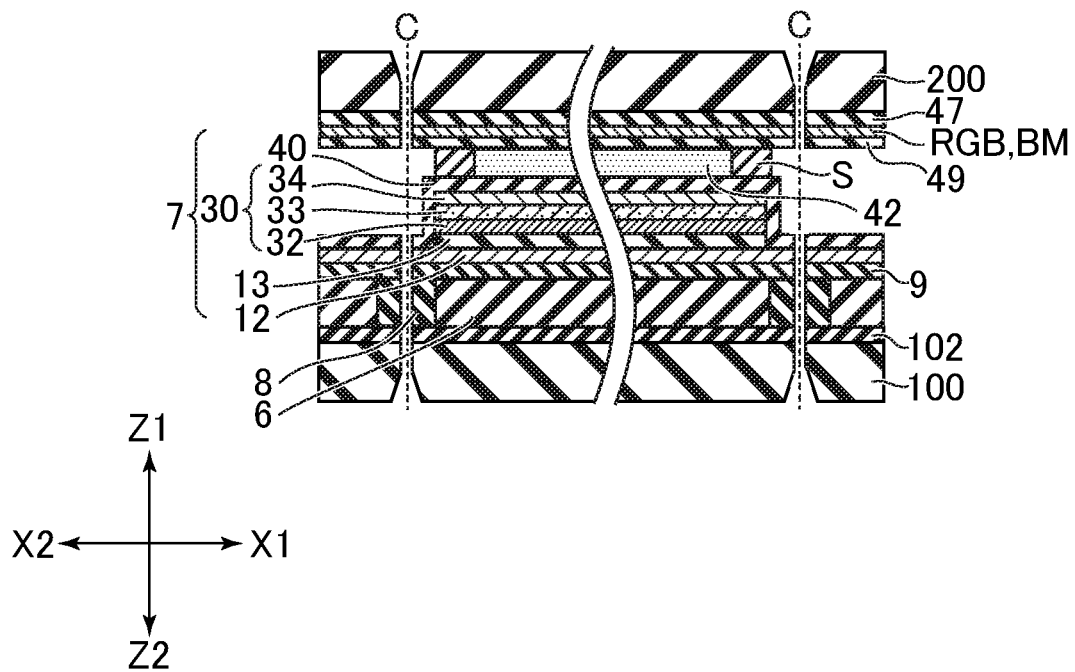
FIG. 26 is a schematic sectional view for explaining the method of manufacturing the display device according to the third embodiment.

Next, as illustrated in FIG. 26, the first glass substrate 100, the first sacrificial layer 102, the first rib layer 8, and the first functional layer 7, and the second glass substrate 200 are cut along the line C, that is, a cut line C.

Figure 27:
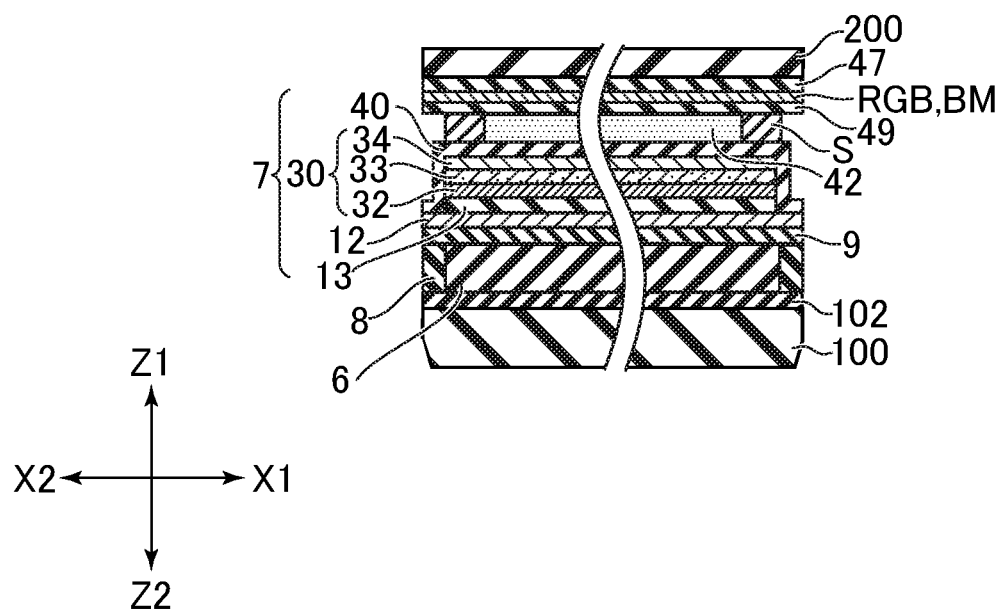
FIG. 27 is a schematic sectional view for explaining the method of manufacturing the display device according to the third embodiment.

Next, as illustrated in FIG. 27, the second glass substrate 200 is polished so that a thickness thereof in the Z direction is reduced to, for example, 0.05 to 0.2 mm or less. A thickness of the polished second glass substrate 200 is not limited to a range of 0.1 mm or less, and may be changed as appropriate according to the strength of the second glass substrate 200. A thickness of the second glass substrate 200 is equivalent to or smaller than a thickness of the first protection film 4. In the above-described way, the entire display device can be thinned. The flexibility is higher in the first embodiment since a glass substrate is not used than in the second embodiment.

Figure 28:
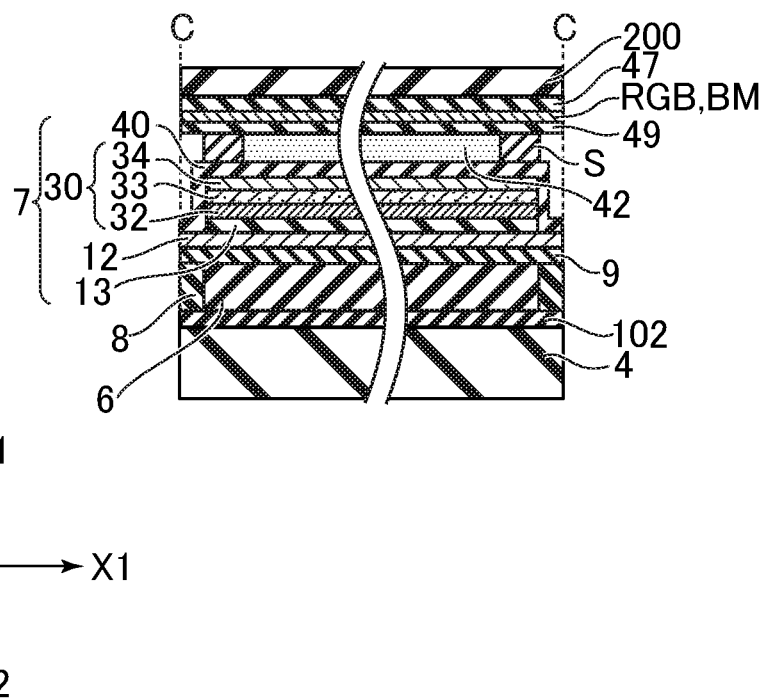
FIG. 28 is a schematic sectional view for explaining the method of manufacturing the display device according to the third embodiment.

Next, as illustrated in FIG. 28, the first glass substrate 100 is peeled from the first sacrificial layer 102, the first resin layer 6, and the first rib layer 8. Finally, the first protection film 4 is stuck below the first sacrificial layer 102. Through the above-described steps, the display device according to the present embodiment is manufactured.

According to the method of manufacturing the display device of the present embodiment, the second glass substrate 200 is polished to be thinned in the Z direction, and thus it is possible to manufacture a flexible display device without forming the second resin layer 46 and the second rib layer 48. Consequently, it is possible to simplify manufacturing steps.

Next, a description will be made of a method of manufacturing a display device (electroluminescent display device) 1c according to a fourth embodiment. FIGS. 29 to 32 are schematic sectional views for explaining a method of manufacturing the display device 1c according to the fourth embodiment. The schematic sectional views are also schematic sectional views in cut surfaces corresponding to the cut line VI-VI in a first glass substrate when substrates are finally bonded to each other.

Figure 29:
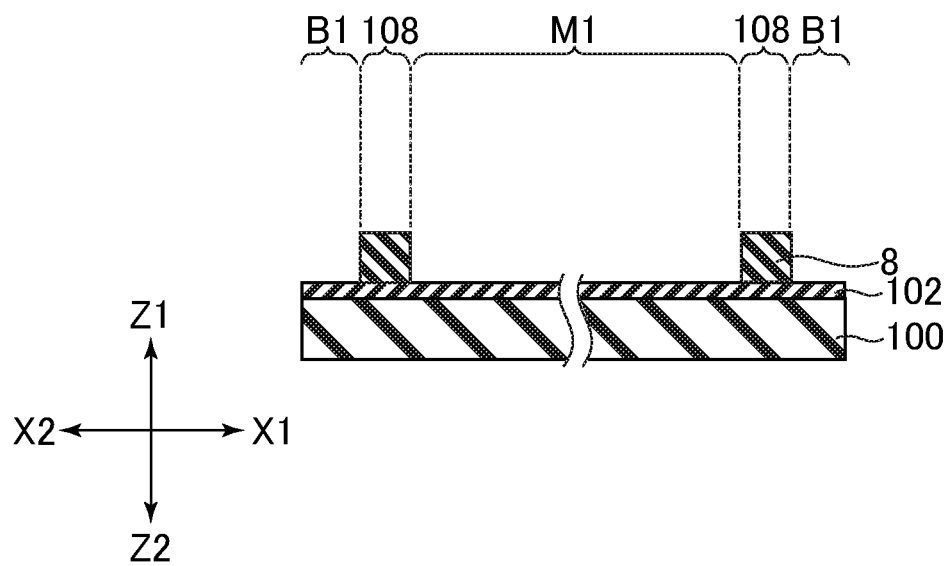
FIG. 29 is a schematic sectional view for explaining a method of manufacturing a display device according to a fourth embodiment.

As illustrated in FIG. 29, the first glass substrate 100 provided with the first sacrificial layer 102 and the first rib layer 8 is prepared. The first blank portion B1 is provided on the first glass substrate 100. As illustrated in FIG. 5, the first frame regions 108 are disposed on both sides of the first blank portion B1 between the adjacent first product regions M1.

Figure 30:
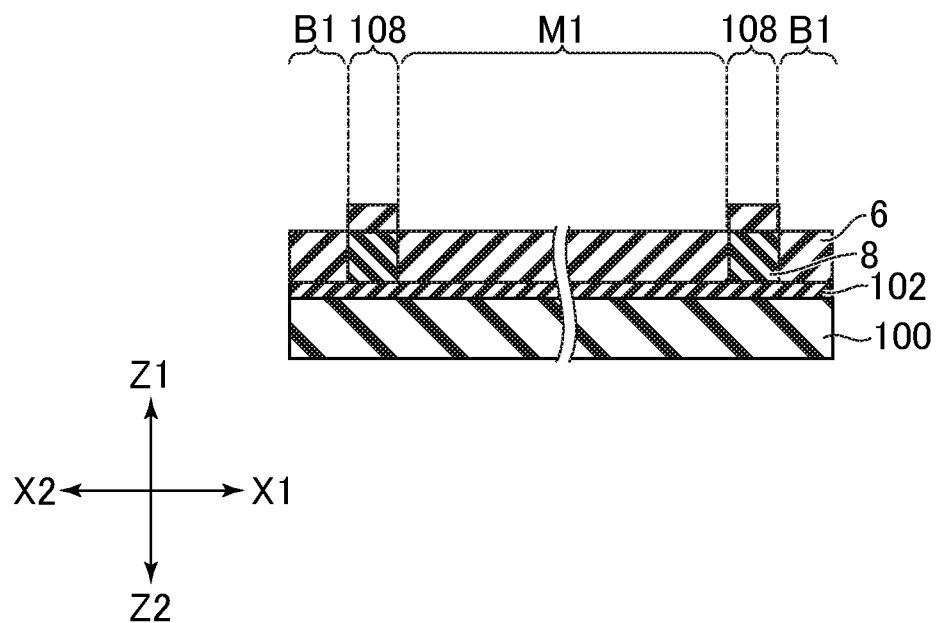
FIG. 30 is a schematic sectional view for explaining the method of manufacturing the display device according to the fourth embodiment.

For example, a liquid polyimide resin is coated on the first product region M1, the first rib layer 8, and the first blank portion B1, is then cured, and is successively baked at a high temperature. Consequently, as illustrated in FIG. 30, the first resin layer 6 is formed on the first rib layer 8 and the first blank portion B1. A coated material is not limited to the polyimide resin, and may be any material as long as the material is still flexible even after being baked.

The first rib layer 8 protrudes upwardly on the first sacrificial layer 102, and thus the first resin layer 6 also protrudes upwardly on the first rib layer 8.

Figure 31:
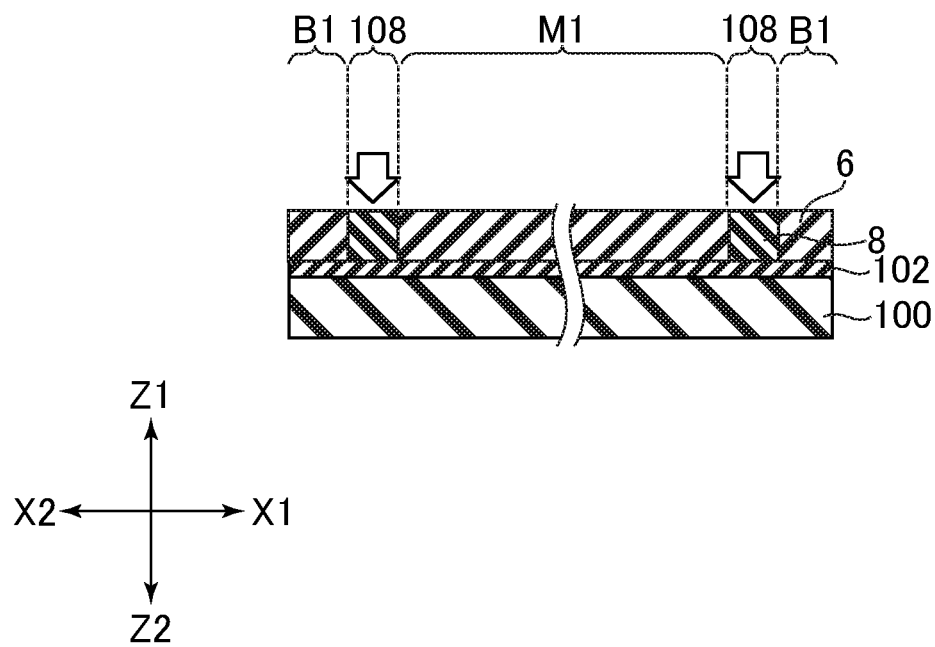
FIG. 31 is a schematic sectional view for explaining the method of manufacturing the display device according to the fourth embodiment.

Next, as illustrated in FIG. 31, scanning and irradiation with, for example, laser light are performed along the first rib layer 8, and thus the first resin layer 6 protruding upwardly on the first rib layer 8 is removed. A method of removing the first resin layer 6 is not particularly limited, and other methods may be used.

Figure 32:
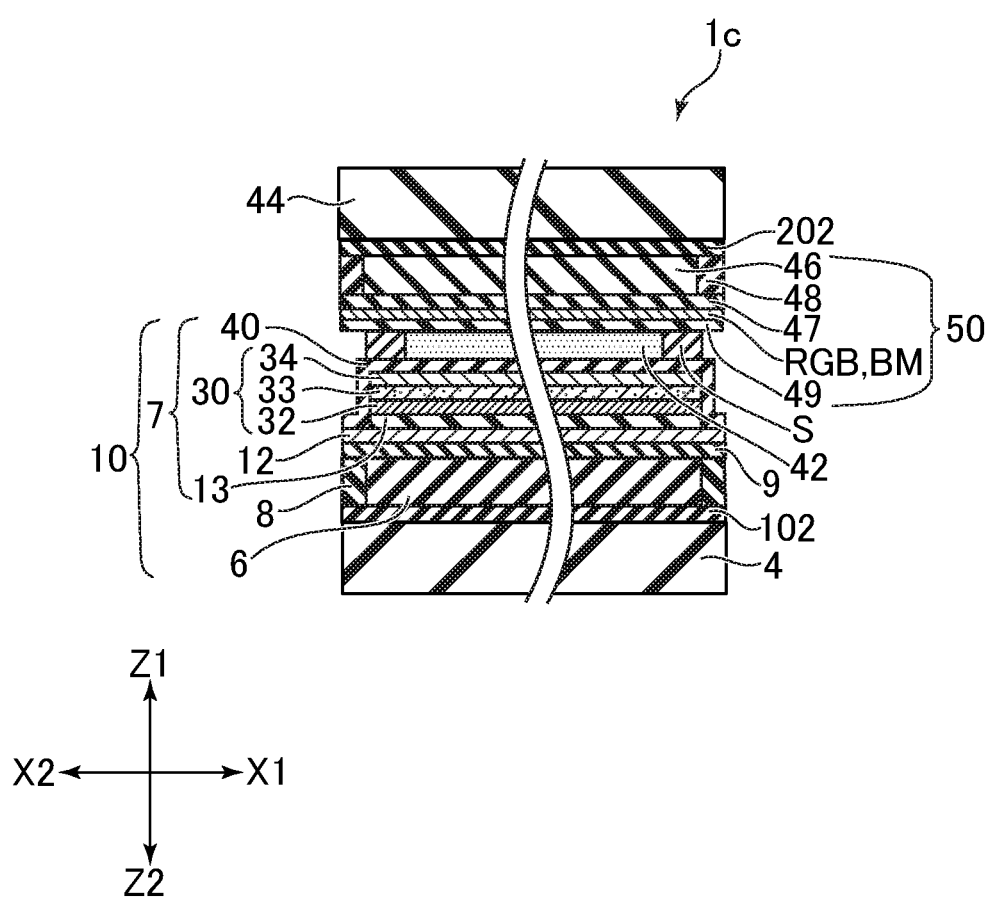
FIG. 32 is a schematic sectional view for explaining the method of manufacturing the display device according to the fourth embodiment.

Next, as illustrated in FIG. 32, the first functional layer 7 is formed on the first resin layer 6 and the first rib layer 8 via the first barrier layer 9. Next, the second glass substrate 200 provided with the counter substrate 50 is bonded to the first glass substrate 100 provided with the first functional layer 7 via the adhesive layer 42 and the seal layer S.

Successively, the first glass substrate 100, the first sacrificial layer 102, the first rib layer 8, the first functional layer 7, the counter substrate 50, the location where the second rib layer 48 overlaps the first rib layer 8, the second sacrificial layer 202, and the second glass substrate 200 are cut.

Next, the first glass substrate 100 and the second glass substrate 200 are peeled, and the first protection film 4 and the second protection film 44 are stuck, so that the display device 1c of the present embodiment is manufactured.

According to the method of manufacturing the display device 1c of the present embodiment, the first resin layer 6 is not present on the first rib layer 8. Consequently, it is possible to prevent stress applied to the first rib layer 8 from spreading to the first resin layer 6 when the first rib layer 8 is cut. Thus, it is possible to easily cut the first glass substrate 100 and the like.

In the first to fourth embodiments, the first glass substrate 100 and the like are cut, the terminal portion 3 is exposed, and the first glass substrate 100 and the second glass substrate 200 are respectively peeled from the first sacrificial layer 102 and the second sacrificial layer 202 so that the display device of each embodiment is manufactured.

Figure 33:
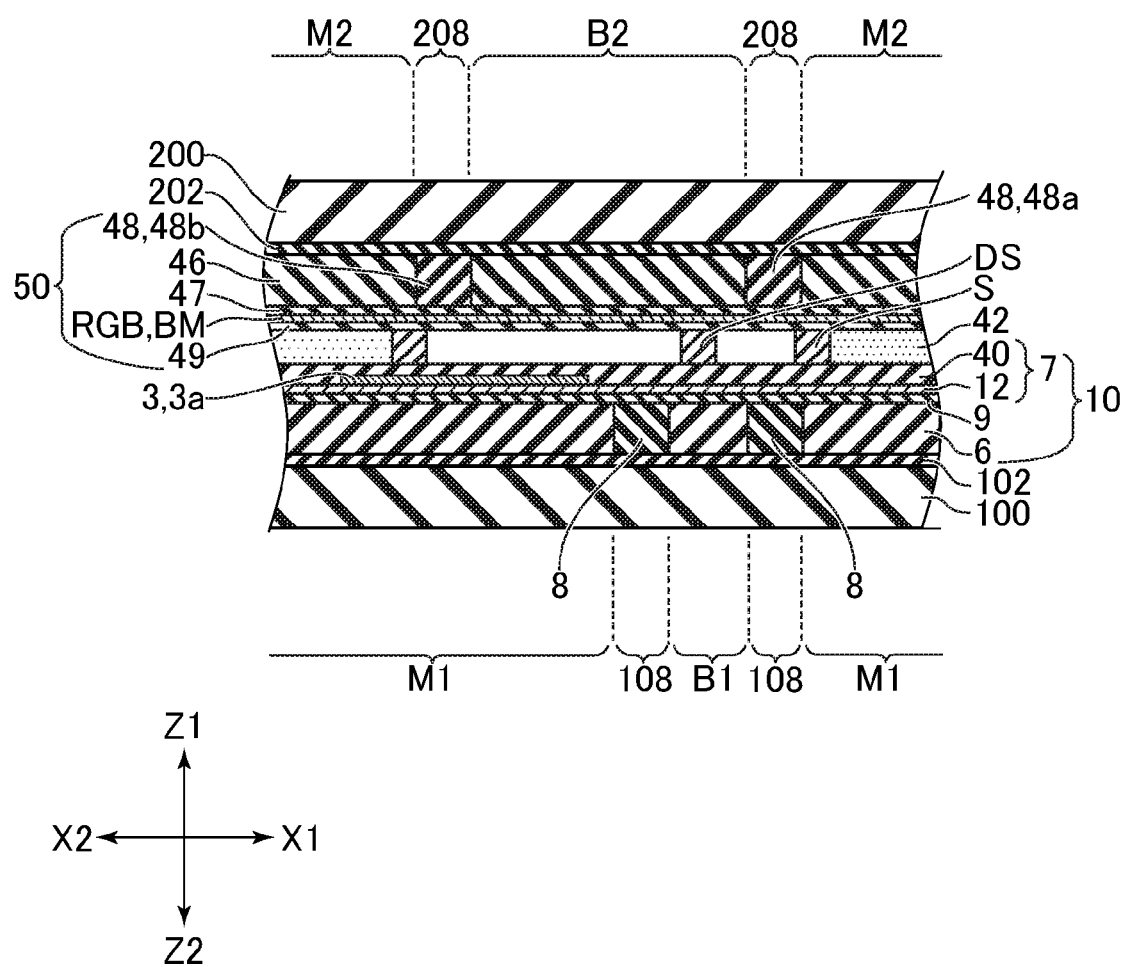
FIG. 33 is a schematic sectional view for explaining a method of manufacturing a display device according to an embodiment.

A method of exposing the terminal portion 3 will be described in detail with reference to FIGS. 33 to 35. FIG. 33 is a schematic sectional view in which the first glass substrate 100 and the second glass substrate 200 are cut along the line XXXIII-XXXIII in FIG. 5. For convenience of description, FIG. 33 does not illustrate the planarized film 13 and the organic electroluminescent element 30.

First, as illustrated in FIG. 33, in the step of sticking the counter substrate 50 formed on the second glass substrate 200 to the first functional layer 7 formed on the first glass substrate 100, at least a part of the terminal portion 3 which is a region where the terminals 3a are formed and the first blank portion B1 adjacent to the terminal portion 3 are disposed to overlap the second blank portion B2 in a plan view.

At this time, a dummy seal DS is disposed between the first blank portion B1 of the TFT substrate 10 and the second blank portion B2 of the counter substrate 50. The dummy seal DS adheres the TFT substrate 10 to the counter substrate 50 at the first blank portion B1 and the second blank portion B2.

A width of the first blank portion B1 and a width of the second blank portion B2 in the X direction are different from each other, and thus the second rib layer 48 has a portion 48a overlapping the first rib layer 8 and a portion 48b not overlapping the first rib layer 8 in a plan view (when viewed from the Z direction in the figure).

The first glass substrate 100 and the second glass substrate 200 are disposed in the above-described manner, and thus the first resin layer 6, the first functional layer 7, the second resin layer 46, and the colored layer RGB are interposed between the first glass substrate 100 and the second glass substrate 200 at the first blank portion B1 and the second blank portion B2.

Figure 34:
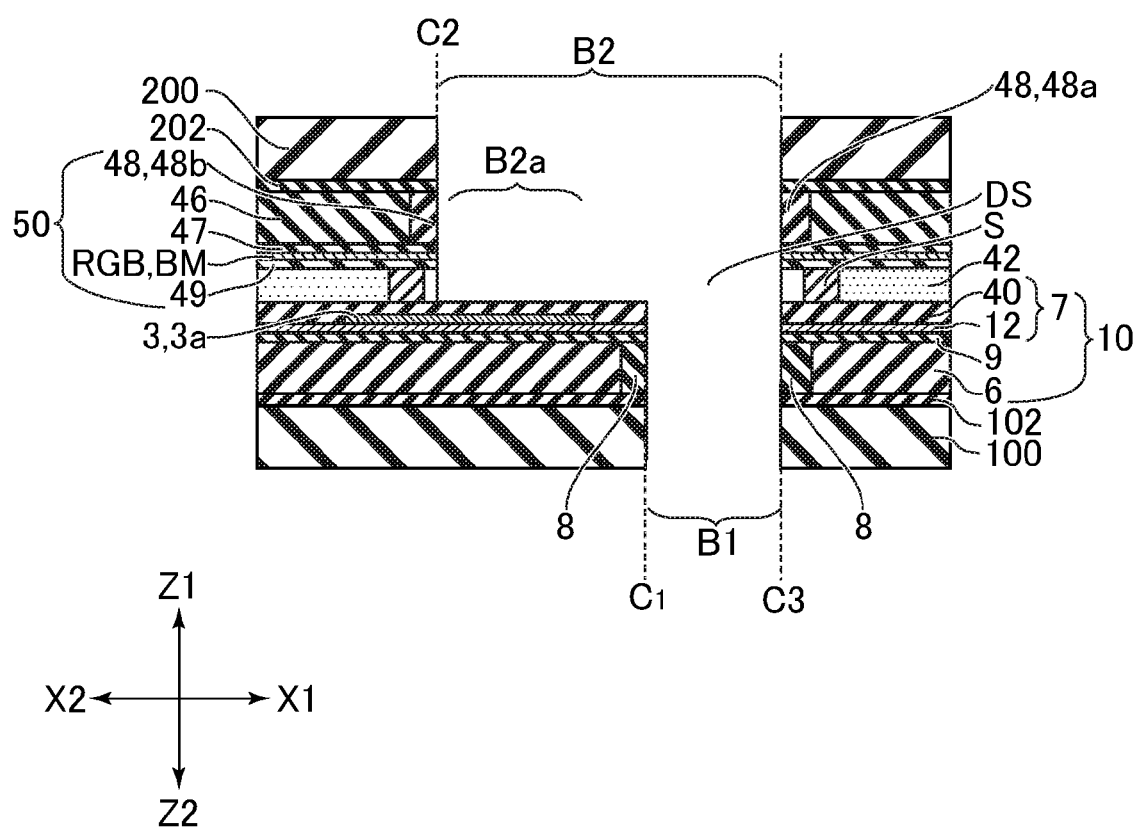
FIG. 34 is a schematic sectional view for explaining the method of manufacturing the display device according to the embodiment.

As illustrated in FIG. 34, cutting is performed from the first glass substrate 100 to the first functional layer 7 along a cut line C1. Cutting is performed from the second glass substrate 200 to the counter substrate 50 along a cut line C2. Cutting is performed from the first glass substrate 100 to the second glass substrate 200 along a cut line C3.

Cutting is performed along the cut lines C1, C2 and C3 as mentioned above so that the first blank portion B1 of the TFT substrate 10 side can be separated, and the second blank portion B2 of the counter substrate 50 side can be separated.

A portion B2a of the second blank portion B2 overlapping the terminal portion 3 in an upward direction (the Z1 direction in the figure) of the terminal 3a is removed along with the second glass substrate 200, the second sacrificial layer, and the counter substrate 50 at the second blank portion B2. Consequently, the sealing layer 40 on the terminal portion 3 is exposed.

Since the first blank portion B1 of the TFT substrate 10 is adhered to the second blank portion B2 of the counter substrate 50 via the dummy seal DS (refer to FIG. 33), the first glass substrate 100, the first sacrificial layer 102, and the TFT substrate 10 at the first blank portion B1 can be removed along with the counter substrate 50 and the like at the second blank portion B2.

The sealing layer 40 exposed in the Z1 direction is dry-etched by using the remaining portion of the second glass substrate 200 as a mask. Consequently, as illustrated in FIG. 35, the sealing layer 40 covering the terminal portion 3 is removed, and thus the terminal 3a is exposed.

As mentioned above, the first blank portion B1 and the second blank portion B2 having different widths in the X direction are removed in a state of overlapping each other, and thus the terminal 3a can be exposed without cutting the second resin layer 46. The sealing layer 40 is dry-etched by using the remaining portion of the second glass substrate 200 as a mask, and thus it is possible to expose the terminal 3a without using a mask therefor.

Figure 36:
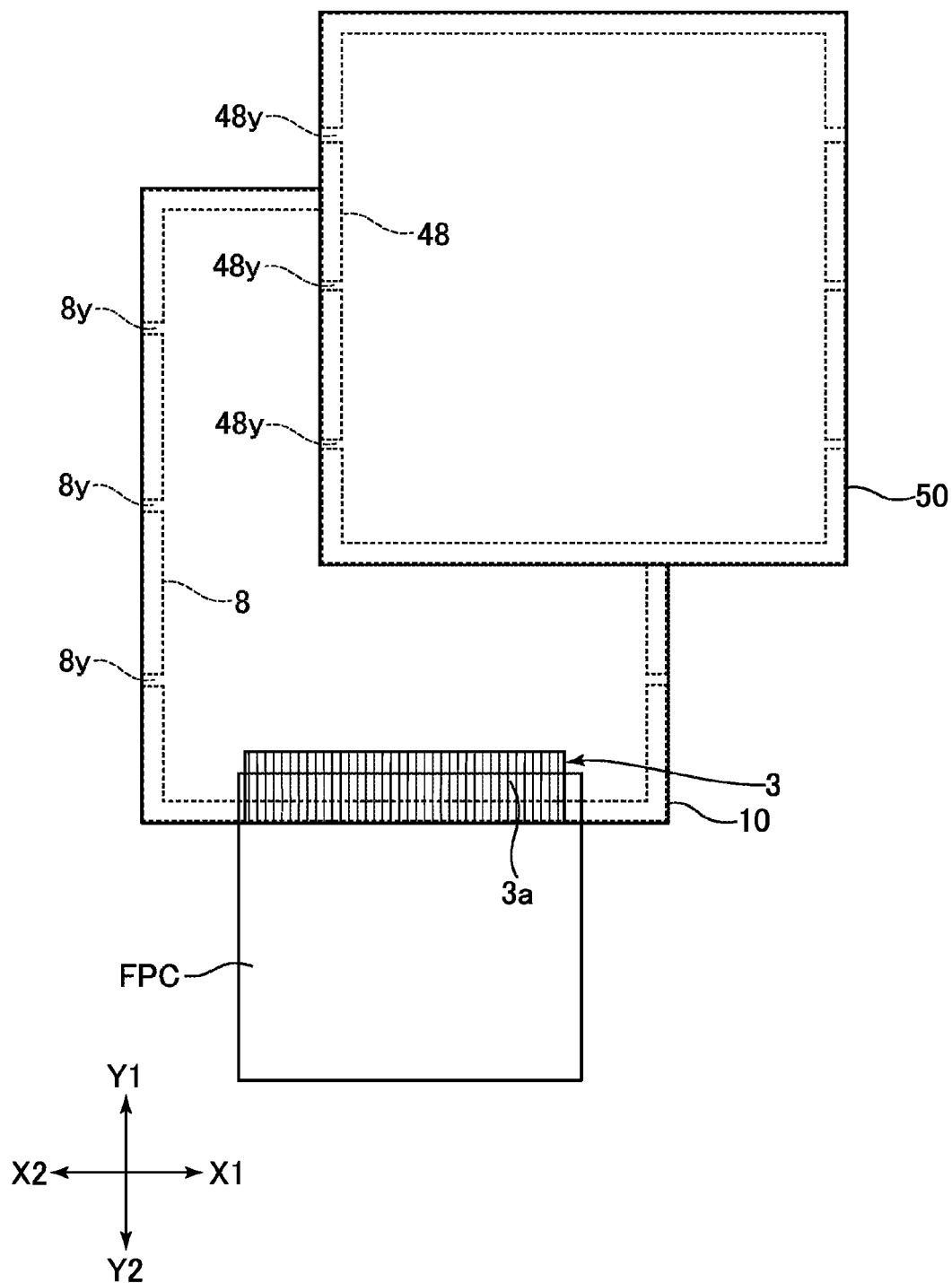
FIG. 36 is an exploded plan view of a display device according to a fifth embodiment.

FIG. 36 is an exploded plan view of a display device according to a fifth embodiment. The display device (TFT substrate 10) has the terminal portion 3 at one end in the Y1 direction and the Y2 direction (Y direction), and the first rib layer 8 and the second rib layer 48 are formed in a discontinuous manner so as to respectively have gaps 8y and 48y in the Y direction. On the other hand, the first rib layer 8 and the second rib layer 48 are continuously formed in the X1 direction and the X2 direction (X direction) in which a plurality of terminals 3a of the terminal portion 3 are arranged, that is, so as not to have gaps. Other structures are the same as those described in the first embodiment.

According to this example, since the first rib layer 8 and the second rib layer 48 are formed in a discontinuous manner, the display device (the TFT substrate 10 and the counter substrate 50) is easily bent in a direction in which the Y axis is bent. For this reason, moisture blocking performance disappears at the gaps 8y and 48y, but cutting a resin material does not greatly hinder individualization if the gaps have sizes not causing a large amount of the resin material to leak out of the gaps. On the other hand, since the display device (the TFT substrate 10 and the counter substrate 50) are hardly bent in a direction in which the X axis is bent, it is possible to reduce a risk that the flexible printed board FPC joined to the terminal portion 3 is peeled therefrom.

FIG. 37 is an exploded plan view of a display device according to a sixth embodiment. In this example, the first rib layer 8 and the second rib layer 48 are formed in the X direction in a discontinuous manner, that is, so as to have gaps 8x and 48x, in addition to the feature illustrated in FIG. 36. In this case, the above-described defect stands out due to the gaps 8x and 48x, but the display device can be easily bent in both of the X and Y directions.

While there have been described what are at present considered to be certain embodiments of the invention, it will be understood that various modifications may be made thereto, and it is intended that the appended claims cover all such modifications as fall within the true spirit and scope of the invention.

For example, in the present embodiment, an organic electroluminescent display device has been described as an example of the display device 1, but the display device 1 may be a liquid crystal display or other display devices.

What is claimed is:

1. A method of manufacturing a display device, comprising:
   preparing a first glass substrate provided with a plurality of first product regions and first frame regions having shapes respectively surrounding the first product regions;
   forming first rib layers made of an inorganic material in the first frame regions of the first glass substrate;
   forming first resin layers in at least the plurality of respective first product regions after forming the first rib layers;
   forming first functional layers which include light emitting element layers on the first resin layers and sealing layers covering the light emitting element layers, on the first rib layers and the first resin layers; and
   cutting the first rib layers and the first functional layers along lines passing through the first frame regions respectively separating the plurality of first product regions,
   wherein, in the step of cutting the first rib layers and the first functional layers, at least the first rib layers and the sealing layers are cut.

2. The method of manufacturing a display device according to claim 1,
   wherein, in the step of preparing the first glass substrate, the first glass substrate is prepared which is further provided with first blank portions between the adjacent first product regions and in which the first frame regions are disposed on both sides of each of the first blank portions, and
   wherein, in the step of forming the first resin layers, the first resin layers are formed to avoid the first blank portions.

3. The method of manufacturing a display device according to claim 2, further comprising:
   preparing a counter substrate, and a step of sticking the counter substrate to the first functional layers before the step of cutting the first rib layers and the first functional layers,
   wherein, in the step of cutting the first rib layers and the first functional layers, the counter substrate is also cut.

4. The method of manufacturing a display device according to claim 3,
   wherein, in the step of sticking the counter substrate, adhesive layers and seal layers surrounding the adhesive layers are provided in the respective first product regions, and the counter substrate is stuck with the adhesive layers and the seal layers, and
   wherein the seal layers are provided at positions avoiding the lines for cutting the first rib layers and the first functional layers.

5. The method of manufacturing a display device according to claim 3,
   wherein, in the step of preparing the counter substrate, the counter substrate is provided to include a second glass substrate provided with a plurality of second product regions and second frame regions having shapes respectively surrounding the second product regions, second rib layers provided in the second frame regions, second resin layers provided in the respective second product regions, and colored layers deposited on the second resin layers, wherein, in the step of sticking the counter substrate, at least some of the first rib layers provided on the first glass substrate are disposed to overlap at least some of the second rib layers provided on the second glass substrate, and wherein, in the step of cutting the first rib layers and the first functional layers, portions of the second rib layers overlapping the first rib layers are cut.

6. The method of manufacturing a display device according to claim 5, further comprising:

polishing and thus thinning the second glass substrate after the step of cutting the first rib layers and the first functional layers.

7. The method of manufacturing a display device according to claim 5, further comprising:

peeling the second glass substrate from the second resin layers and the second rib layers after the step of cutting the first rib layers and the first functional layers.

8. The method of manufacturing a display device according to claim 7, wherein, in the step of preparing the counter substrate, the counter substrate is prepared so that a second sacrificial layer is provided between the second glass substrate and the second resin layers, and between the second glass substrate and the second rib layers, and wherein, in the step of peeling the second glass substrate, the second glass substrate is peeled from the second sacrificial layer.

9. The method of manufacturing a display device according to claim 7, further comprising:

sticking a second protection film to a surface of the layer from which the second glass substrate is peeled after the step of peeling the second glass substrate.

10. The method of manufacturing a display device according to claim 5, wherein, in the step of forming the first functional layers, the first functional layers are formed to further include circuit layers which are disposed in the plurality of respective first product regions and have circuits electrically connected to the light emitting element layers, wherein the circuits have terminals for electrical connection to an external device, wherein the terminals are covered with the sealing layers, wherein, in the step of preparing the counter substrate, the counter substrate is provided so that second blank portions are further provided between the adjacent second product regions, and the second frame regions are disposed on both sides of each of the second blank portions, wherein, the in the step of sticking the counter substrate, the counter substrate is stuck so that the second blank portions overlap the terminals and the first blank portions adjacent to the terminals, and some of the second rib layers do not overlap the first rib layers, wherein, in the step of cutting the first rib layers and the first functional layers, some of the second rib layers not overlapping the first rib layers are also cut, and wherein the method further includes exposing the sealing layers by removing the second blank portions overlapping the terminals over the terminals along with the second resin layers and the colored layers; and dry-etching the sealing layers by using a remaining portion of the second glass substrate as a mask, so as to expose the terminals.

11. The method of manufacturing a display device according to claim 10, wherein, in the step of sticking the counter substrate, the first blank portions adjacent to the terminals and the second blank portions overlapping the terminals are adhered to each other so as to interpose the first resin layers, the first functional layers, the second resin layers, and the colored layers therebetween, and wherein, in the step of removing the second blank portions overlapping the terminals, the first blank portions adhered to the second blank portions are also removed.

12. The method of manufacturing a display device according to claim 1, wherein, in the step of preparing the first glass substrate, the first glass substrate is prepared which is further provided with first blank portions between the adjacent first product regions and in which the first frame regions are disposed on both sides of each of the first blank portions, wherein, in the step of forming the first resin layers, the first resin layers are also formed on the first rib layers and the first blank portions, and wherein the method further includes a step of removing the first resin layers formed on the first rib layers before the step of forming the first functional layers.

13. The method of manufacturing a display device according to claim 12, wherein the first rib layers linearly extend in different directions, and have locations where two of the first rib layers extend in the different directions and intersect and overlap each other, in a plan view, wherein, in the step of forming the first rib layers, a portion located at the location where the first rib layers intersect and overlap each other is formed to be thicker than other portions, and wherein, in the step of removing the first resin layers formed on the first rib layers, scanning and irradiation with laser light are performed along the first rib layers.

14. The method of manufacturing a display device according to claim 1, further comprising:

peeling the first glass substrate from the first resin layers and the first rib layers after the step of cutting the first rib layers and the first functional layers.

15. The method of manufacturing a display device according to claim 14, wherein, in the step of preparing the first glass substrate, the first glass substrate is prepared in a state in which a first sacrificial layer is deposited on the first glass substrate, wherein, in the step of forming the first rib layers, the first rib layers are formed on the first sacrificial layer, wherein, in the step of forming the first resin layers, the first resin layers are formed on the first sacrificial layer, and wherein, in the step of peeling the first glass substrate, the first glass substrate is peeled from the first sacrificial layer.

16. The method of manufacturing a display device according to claim 14, further comprising:

sticking a first protection film to a surface of the layer from which the first glass substrate is peeled after the step of peeling the first glass substrate.

17. A display device comprising:

a resin layer;

a rib layer that surrounds the resin layer and is made of an inorganic material having a higher level of moistureproof than moistureproof of a material of the resin layer;

a functional layer that is formed on an upper surface of the resin layer and the rib layer;

a protection film that covers a lower surface of the resin layer; and another inorganic material layer that is thinner than each of the protection film and the resin layer, between the protection film and the resin layer, wherein the functional layer includes a light emitting element layer emitting light as a result of luminance of each of a plurality of unit pixels forming an image being controlled, and a sealing layer covering the light emitting element layer.

18. The display device according to claim 17, wherein the protection film is thicker than the resin layer.

19. A display device comprising:

a resin layer;

a rib layer that surrounds the resin layer and is made of an inorganic material having a higher level of moistureproof than moistureproof of a material of the resin layer;

a functional layer that is formed on an upper surface of the resin layer and the rib layer; and a protection film that covers a lower surface of the resin layer, wherein the functional layer includes a light emitting element layer emitting light as a result of luminance of each of a plurality of unit pixels forming an image being controlled, and a sealing layer covering the light emitting element layer, wherein the light emitting element layer includes a plurality of organic light emitting elements, wherein the display device further includes a sealing layer that is made of a material including SiN disposed on the functional layer;

a seal layer and a fill layer that surround the plurality of organic light emitting elements on the sealing layer, at least a part of the seal layer being disposed inside the rib layer and the fill layer being disposed inside the seal layer, in a plan view; and a glass substrate that is disposed over the fill layer and the seal layer, wherein the protection film is thicker than the resin layer, and wherein the glass substrate is thinner than the protection film.

* * * * *